(12) United States Patent
Camenforte et al.

(10) Patent No.: US 12,417,965 B2
(45) Date of Patent: Sep. 16, 2025

(54) INTERCONNECT FOR IC PACKAGE

(71) Applicant: TEXAS INSTRUMENTS INCORPORATED, Dallas, TX (US)

(72) Inventors: Ruby Ann Merto Camenforte, Mabalacat (PH); Floro Lopez Camenforte, Mabalacat (PH); Dolores Babaran Milo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/536,999

(22) Filed: Nov. 29, 2021

(65) Prior Publication Data

US 2023/0170285 A1    Jun. 1, 2023

(51) Int. Cl.
| | |
|---|---|
| *H01L 21/48* | (2006.01) |
| *H01L 23/00* | (2006.01) |
| *H01L 23/31* | (2006.01) |
| *H01L 23/495* | (2006.01) |
| *H01L 23/544* | (2006.01) |

(52) U.S. Cl.
CPC .... *H01L 23/49582* (2013.01); *H01L 21/4828* (2013.01); *H01L 23/3121* (2013.01); *H01L 23/49586* (2013.01); *H01L 23/544* (2013.01); *H01L 24/16* (2013.01); *H01L 24/48* (2013.01); *H01L 24/81* (2013.01); *H01L 2223/54413* (2013.01); *H01L 2224/10175* (2013.01); *H01L 2224/16245* (2013.01); *H01L 2224/48245* (2013.01); *H01L 2224/48996* (2013.01)

(58) Field of Classification Search
CPC ......... H01L 23/49503; H01L 23/49541; H01L 23/49582; H01L 23/49586
See application file for complete search history.

(56) References Cited

U.S. PATENT DOCUMENTS

| | | | |
|---|---|---|---|
| 5,618,576 A | 4/1997 | Baek | |
| 6,518,653 B1 | 2/2003 | Takagi | |
| 9,466,556 B2 | 10/2016 | Sato et al. | |
| 9,653,385 B1 | 5/2017 | Fang | |
| 2010/0295161 A1* | 11/2010 | Koduri | ............... H01L 21/4842 |
| | | | 257/676 |
| 2011/0127658 A1 | 6/2011 | Tzu | |
| 2018/0190608 A1* | 7/2018 | Gupta | ............... H01L 23/49503 |
| 2020/0144166 A1 | 5/2020 | Hayashi | |

* cited by examiner

*Primary Examiner* — Walter H Swanson
(74) *Attorney, Agent, or Firm* — Ronald O. Neerings; Frank D. Cimino

(57) ABSTRACT

An integrated circuit (IC) package includes an interconnect comprising patches of unoxidized metal that are circumscribed by a region of roughened metal formed of oxidized metal. The IC package also includes a die mounted on the interconnect. The die is conductively coupled to at least a subset of the patches of unoxidized metal.

23 Claims, 17 Drawing Sheets

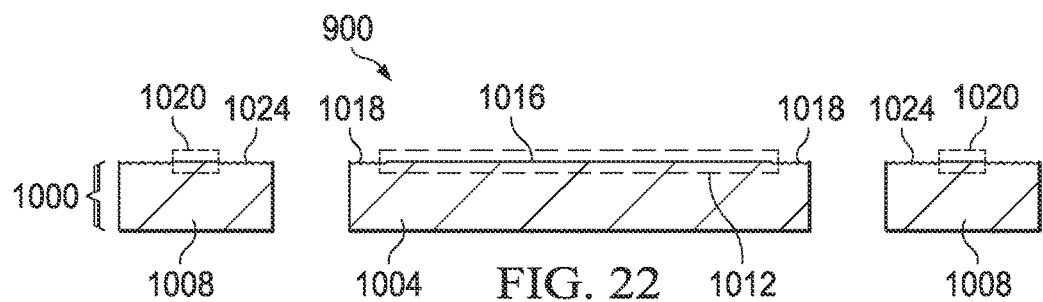
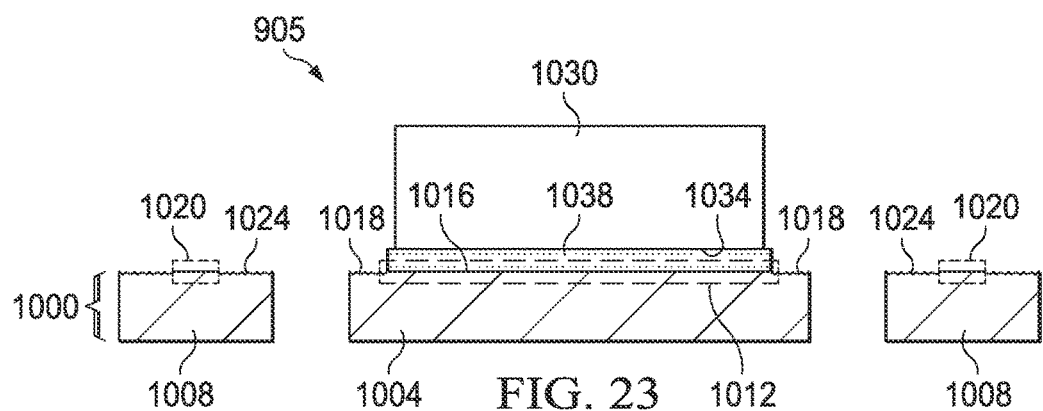
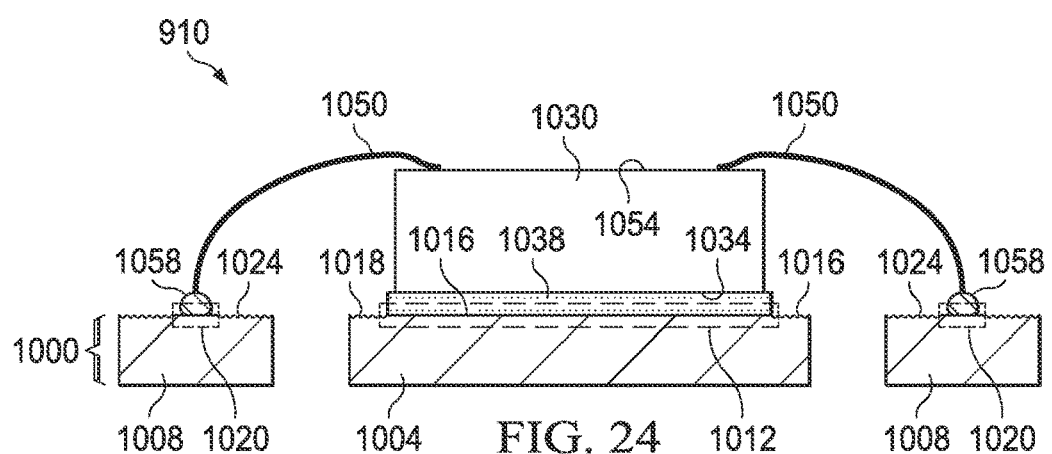
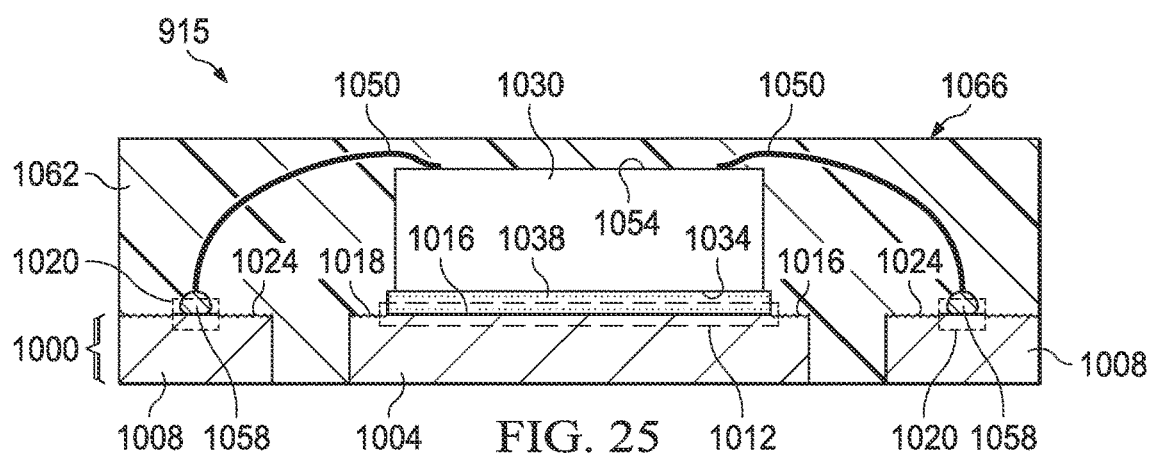

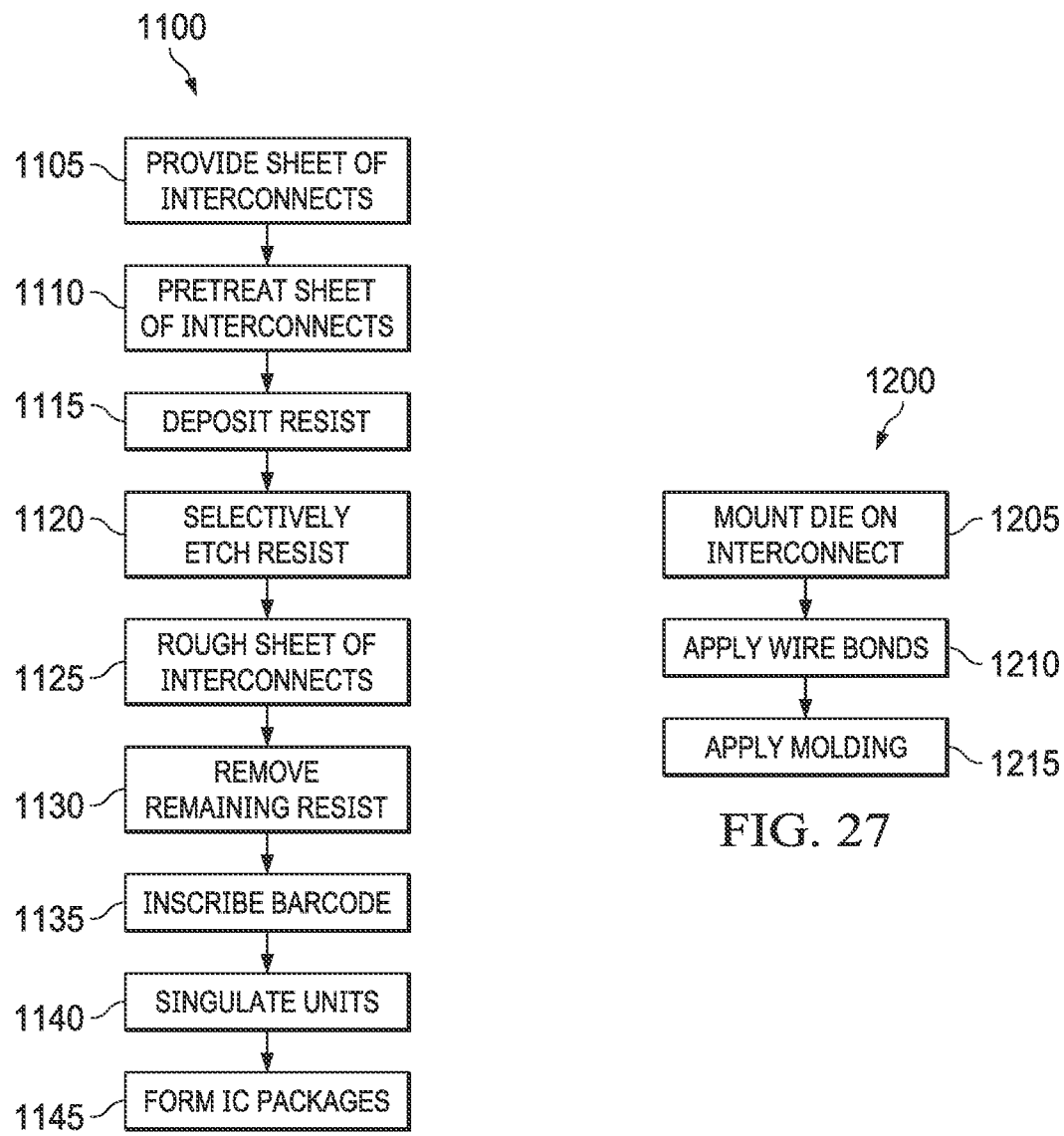

INTERCONNECT FOR IC PACKAGE

TECHNICAL FIELD

This description relates to an interconnect for an integrated circuit (IC) package.

BACKGROUND

An interconnect (alternatively referred to as a lead frame) is a metal structure inside an integrated circuit (IC) package that carries signals from a die of the IC package to external components. An interconnect includes a central die pad, where the die is placed, surrounded by pads situated on a periphery of the interconnect.

Interconnects are manufactured by removing material from a flat plate of copper, copper-alloy, an iron nickel alloy, etc. To form the IC package, a die is adhered to the die pad of the interconnect. Also, wire bonds are attached between the die and pads of the interconnect to connect the die to the pads. In a process referred to as encapsulation, a plastic case is molded around the lead frame and die, exposing only the pads. The pads are cut off outside the plastic body and any exposed supporting structures are cut away.

SUMMARY

A first example relates to an integrated circuit (IC) package that includes an interconnect with patches of unoxidized metal that are circumscribed by a region of roughened metal formed of oxidized metal. The IC package also includes a die mounted on the interconnect. The die is conductively coupled to at least a subset of the patches of unoxidized metal.

A second example relates to a method for forming an IC package. The method includes selectively etching a resist overlaying a sheet of interconnects to provide a mask of resist on the sheet of interconnects. The method also includes roughing, in response to the selectively etching, the sheet of interconnects. The method includes removing a remaining portion of the resist to provide the sheet of interconnects with units that have a smoothed portion and a roughened portion. The smoothed portion of the units has spaced apart patches of unoxidized metal, and the roughened portion has oxidized metal that circumscribed the patches of unoxidized metal.

BRIEF DESCRIPTION OF THE DRAWINGS

FIG. 22 illustrates a first stage of another example method for forming an IC package.

FIG. 23 illustrates a second stage of the other example method for forming an IC package.

FIG. 24 illustrates a third stage of the other example method for forming the IC package.

FIG. 25 illustrates a fourth stage of the other example method for forming the IC package.

FIG. 26 illustrates a flowchart of an example method for processing a sheet of interconnects for IC packages.

FIG. 27 illustrates a flowchart of an example method for forming an IC package.

DETAILED DESCRIPTION

This description relates to IC packages and methods for forming the IC packages. The IC packages include an interconnect that has a smoothed portion (unoxidized metal, such as unoxidized copper) and a roughened portion (oxidized metal, such as oxidized copper). More particularly, the interconnect includes spaced apart patches of unoxidized metal (part of the smoothed portion) that are circumscribed by a roughened region formed of oxidized metal (part of the roughened portion).

In some examples, the die is attached to the interconnect with a flip chip process. In such examples, the die includes posts extending from a surface of the die to contact the spaced apart patches of unoxidized metal on the interconnect. The spaced apart patches of unoxidized metal on the interconnect allow for improved solder wetting to securely mount the die on the interconnect. In complementary fashion, the roughened region of the interconnect that circumscribes the spaced apart patches of unoxidized metal impedes the flow of solder, thereby preventing solder bridges between posts of the die.

In other examples, the die is mounted on the interconnect with wire bonding. In such examples, the interconnect includes a die pad at a center of the interconnect, and pads at a periphery of the interconnect. In these examples, a first surface of the die is mountable on the die pad. The die is adhered to the die pad with an epoxy to electrically insulate the die from the die pad. Also, wire bonds are adhered to a second surface of the die, and to patches of the pads of the interconnect. The wire bonds are adhered to the patches of unoxidized metal on the pads of the interconnect with solder, and the patches of unoxidized metal provide improved solder wetting. In complementary fashion, the roughened region of the interconnect that circumscribes the spaced apart patches of unoxidized metal impedes the flow of solder, thereby preventing solder bridges between wire bonds.

Additionally, a molding (e.g., a mold compound) encases the interconnect and the die to provide the IC package, such as a quad flat no leads (QFN) IC package or a dual flat no leads (DFN) IC package. The portion of roughened metal (e.g., oxidized copper) on the interconnect provides improved purchase (e.g., grip) for the molding, such that the molding is securely adhered to the interconnect. The patches of unoxidized metal (forming the portion of smoothed metal) provide improved solder wetting compared to a region of roughened metal. Complementarily, the roughened portion formed of oxidized metal impedes the flow of solder and provides improved adherence to the molding relative to the smoothed region. Accordingly, by providing the interconnect with both the smoothed portion (e.g., unoxidized metal) and the roughened portion (e.g., oxidized metal), the benefits of an interconnect formed with either unoxidized metal or roughened metal are provided without the corresponding hindrances.

Figure 1:
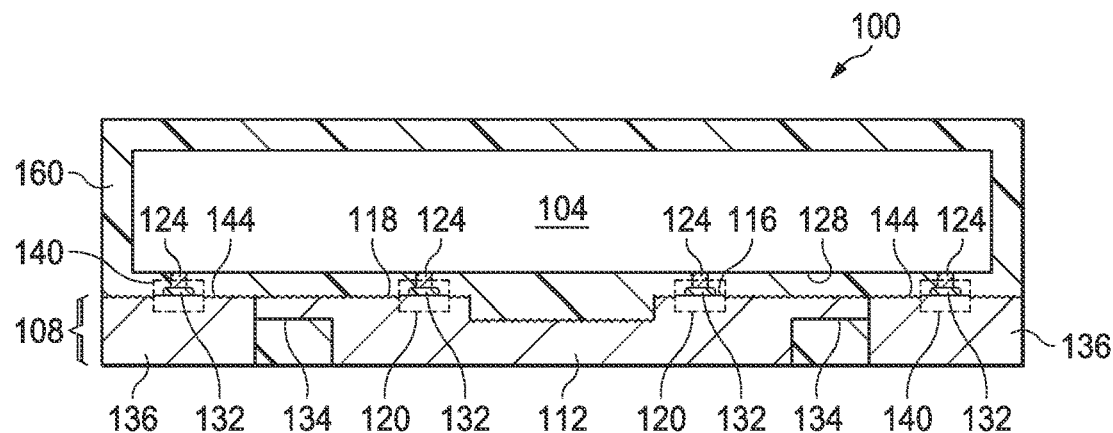
FIG. 1 illustrates a diagram of a cross-sectional view of an example of an integrated circuit (IC) package.

FIG. 1 illustrates a cross-sectional view of an integrated circuit (IC) package 100. The IC package 100 includes a die 104 mounted on an interconnect 108 (e.g., a lead frame). In the example illustrated, the die 104 is mounted on the interconnect 108 using flip chip techniques to form a QFN or a DFN package. The interconnect 108 has a smoothed portion of metal (e.g., unoxidized copper) and a roughened portion of metal (e.g., oxidized metal, such as oxidized copper). In particular, the interconnect 108 includes a central region 112 that has a surface 116 that has a region of roughened metal 118 (oxidized metal) that is interrupted by spaced apart patches of unoxidized metal 120. That is, the spaced apart patches of unoxidized metal 120, which are a component of the smoothed portion of the interconnect 108 are circumscribed by the region of roughened metal 118 (e.g., oxidized metal), which is a component of the roughened portion of the metal. Stated differently, the smoothed portion of the interconnect 108 includes the spaced apart patches of unoxidized metal 120 that are circumscribed by part of the roughened portion of the interconnect, namely the region of roughened metal 118 of the central region 112.

The die 104 includes posts 124 that extend from a surface 128 of the die 104 to the spaced apart patches of unoxidized metal 120 on the central region 112 of the interconnect 108. The posts 124 are adhered to the spaced apart patches of unoxidized metal 120 with solder 132 (e.g., a solder ball or a solder paste). The region of roughened metal 118 circumscribes the spaced apart patches of unoxidized metal 120. Thus, the region of roughened metal 118 forms a continuous surface on the central region 112 of the interconnect 108, such that a point of the region of roughened metal 118 of the surface 116 of the central region 112 is connected to another point on the central region 112 through a path (linear or curved) without crossing one of the spaced apart patches of unoxidized metal 120.

Figure 2:
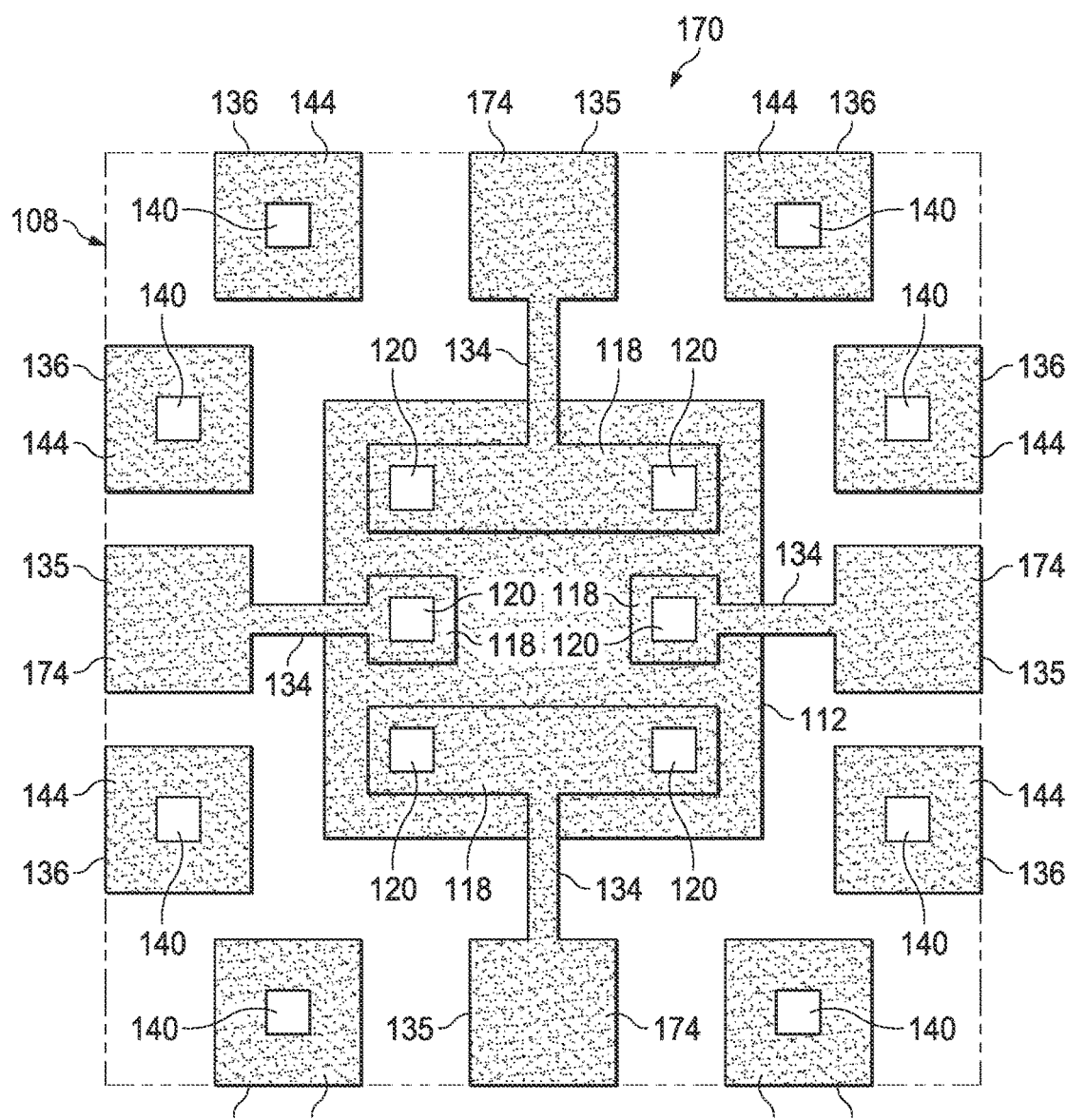
FIG. 2 illustrates an overhead view of an interconnect of FIG. 1.

FIG. 2 illustrates an overhead view 170 of the interconnect 108 of FIG. 1, wherein the die 104 is removed. Thus, for purposes of simplification of explanation, FIGS. 1 and 2 employ the same reference numbers to denote the same structures. The interconnect 108 includes extensions 134 that extend from the central region 112 of the interconnect to a pad (hidden from view) of a first type arranged on a periphery of the interconnect 108. The interconnect 108 also includes pads 136 of a second type arranged around a periphery of the interconnect 108. The pads 136 of the second type include a patch of unoxidized metal 140 that is circumscribed by a remaining portion of roughened metal 144 (e.g., oxidized metal). That is, the pads 136 of the second type include a first portion of unoxidized metal, namely, the patch of unoxidized metal 140, and a second (remaining) portion of oxidized metal, namely the region of roughened metal 144. Thus, the patch of unoxidized metal 140 on the pads 136 of the second type is part of the smoothed portion of the interconnect 108. Similarly, the region of roughened metal 144 on the pads 136 of the second type is part of the roughened portion of the interconnect 108. Conversely, the pads 135 of the first type have a surface that is covered completely (or nearly completely) with roughened metal (hidden from view in FIG. 1).

In the example illustrated, there are six (6) spaced apart patches of unoxidized metal 120 on the central region 112 of the interconnect 108, only some of which are labeled. In other examples, there are more or less spaced apart patches of unoxidized metal 120. Additionally, there are four (4) pads 135 of the first type and eight (8) pads 136 of the second type, only some of which are labeled. In various examples, there are more or less pads 135 of the first type and more or less pads 136 of the second type. The spaced apart patches of unoxidized metal 120 are circumscribed by the region of roughened metal 118 of the central region 112. Additionally, as illustrated in the overhead view 170, the pads 136 of the second type are arranged at the periphery of the interconnect 108. The pads 136 of the second type include the patch of unoxidized metal 140 circumscribed by the region of roughened metal 144. Conversely, the pads 135 of the first type include a region of roughened metal 174 and do not include a patch of unoxidized metal.

Referring back to FIG. 1, the spaced apart patches of unoxidized metal 120 at the central region 112 of the interconnect 108 enable excellent solder wetting. Similarly, patches of unoxidized metal 140 on the pads 136 of the second type also enable excellent solder wetting. Accordingly, the spaced apart patches of unoxidized metal 120 and the patches of unoxidized metal 140 enable the posts 124 to be securely adhered to the spaced apart patches of unoxidized metal 120 of the central region 112 of the interconnect 108 and to the pads 136 of the second type. Accordingly, the die 104 is electrically coupled to the set of unoxidized metal patches, namely, the spaced patches of unoxidized metal 120 on the central region 112 and the patches of unoxidized metal 140 on the pads 136 of the second type. In complementary fashion, the region of roughened metal 118 on the central region 112 of the interconnect provides a barrier for the solder 132 to prevent solder bridging between posts 124 of the die 104.

The interconnect 108 and the die 104 are encased in a molding 160. The molding 160 is formed of a molding compound, such as plastic or similar material. Also, the region of roughened metal 118 on the central region 112, the region of roughened metal 144 on the pads 136 of the second type and the roughened metal 174 on the pads 135 of the first type improve adherence of the molding 160 to the interconnect 108.

By employment of the interconnect 108, the benefits of roughing portions (oxidizing metal) of the interconnect 108 are attained without drawbacks. More particularly, because the interconnect 108 includes the spaced apart patches of unoxidized metal 120 (components of the smoothed portion)

on the central region 112 and the pads 136 of the second type include the patches of unoxidized metal 140, the die 104 is securely mounted on the interconnect 108 to enable robust electrical communication between the die 104 and the pads 135 of the first type and the pads 136 of the second type. More specifically, the smoothed patches of unoxidized metal allow for excellent solder wetting. Complementarily, the interconnect 108 also includes the region of roughened metal 144 at the pads 136 of the second type (circumscribing the patches of unoxidized metal 140), the region of roughened metal 118 of the central region 112 (circumscribing the spaced apart patches of unoxidized metal 120) as well as the roughened metal 174 on the pads 135 of the first type. These regions of oxidize metal forming the region of roughened metal 118 of the central region 112 and the regions of roughened metal 144 on the pads 136 of the second type impede the flow of solder, thereby preventing solder bridges. Stated differently, the regions of oxidize metal forming the region of roughened metal 118 on the central region of the interconnect 108 provides a barrier to prevent solder adhering to a given post 124 to the central region 112 or a pad 136 of the second type from bridging to another post 124. These regions of roughened metal, such as the region of roughened metal 118, the roughened metal 174 on the pads 135 of the first type and roughened metal 144 on the pads 136 of the second type also improve purchase (e.g., grip) between the interconnect 108 and the molding 160, thereby improving adherence between the molding 160 and the interconnect 108. Accordingly, providing the interconnect 108 with patches of unoxidized metal (e.g., smoothed copper) and regions of roughened metal (e.g., oxidized copper), provides the benefits of an interconnect formed with an unoxidized metal and an interconnect formed with an unoxidized metal without the respective drawbacks.

Figure 3:
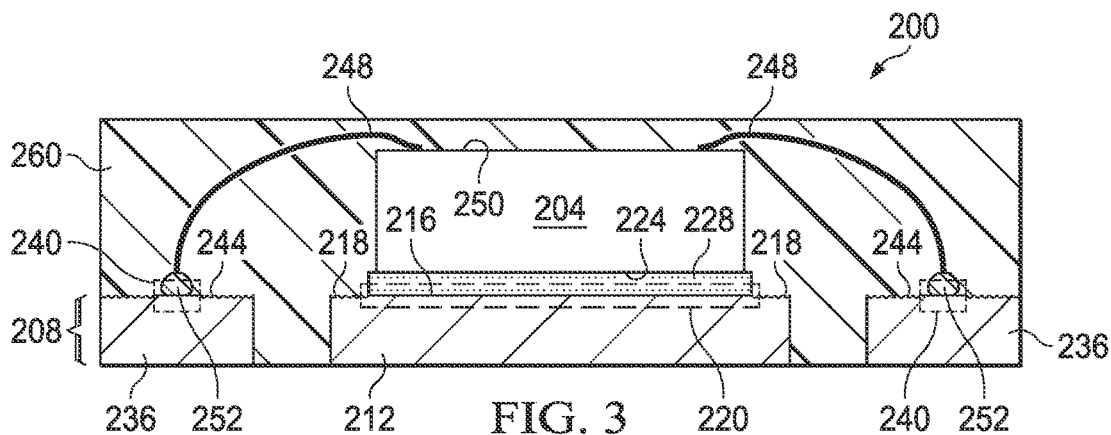
FIG. 3 illustrates a diagram of a cross-sectional view of another example of an IC package.

FIG. 3 illustrates a cross-sectional view of another example IC package 200. The IC package 200 includes a die 204 mounted on an interconnect 208 (e.g., a lead frame) with wire bonding to form a QFN or DFN package. More particularly, the die 204 is mounted on a die pad 212 of the interconnect 208. The interconnect 208 has a smoothed portion of metal (e.g., unoxidized copper) and a roughened portion of metal (e.g., oxidized metal, such as oxidized copper). In particular, the die pad 212 has a surface 216 that has a region of roughened metal 218 (oxidized metal) that is interrupted by a patch of unoxidized metal 220. That is, the patch of unoxidized metal 220, which is a component of the smoothed portion of the interconnect 208 is circumscribed by the region of roughened metal 218 (e.g., oxidized metal), which is a component of the roughened portion of the metal. Stated differently, the smoothed portion of the interconnect 208 includes the patch of unoxidized metal 220 that is circumscribed by part of the roughened portion of the interconnect 208, namely the region of roughened metal 218 of the die pad 212.

A first surface 224 of the die 204 is mounted on the patch of unoxidized metal 220 with a layer of epoxy 228 (e.g., an industrial glue) to adhere the die 204 to the die pad 212 and to provide electrical isolation between the first surface 224 of the die 204 and the die pad 212. That is, the first surface 224 of the die 204 is adhered to the patch of unoxidized metal 220 of the die pad 212 with the epoxy 228. The region of roughened metal 218 circumscribes the patch of unoxidized metal 220. Thus, the region of roughened metal 218 forms a continuous surface, such that a point of the region of roughened metal 218 of the surface 216 of the die pad 212 is connected to another point on the surface 216 through a path (linear or curved) without crossing the patch of unoxidized metal 220.

The interconnect 208 also includes pads 236 arranged around a periphery of the interconnect 208. The pads 236 include a patch of unoxidized metal 240 that is circumscribed by a remaining portion of roughened metal 244 (e.g., oxidized metal). That is, the pads 236 include a first portion of unoxidized metal, namely, the patch of unoxidized metal 240, and a second (remaining) portion of oxidized metal, namely the region of roughened metal 244. Thus, the patch of unoxidized metal 240 on the pads 236 is part of the smoothed portion of the interconnect 208. Similarly, the region of roughened metal 244 on the pads 236 is part of the roughened portion of the interconnect 208.

Figure 4:
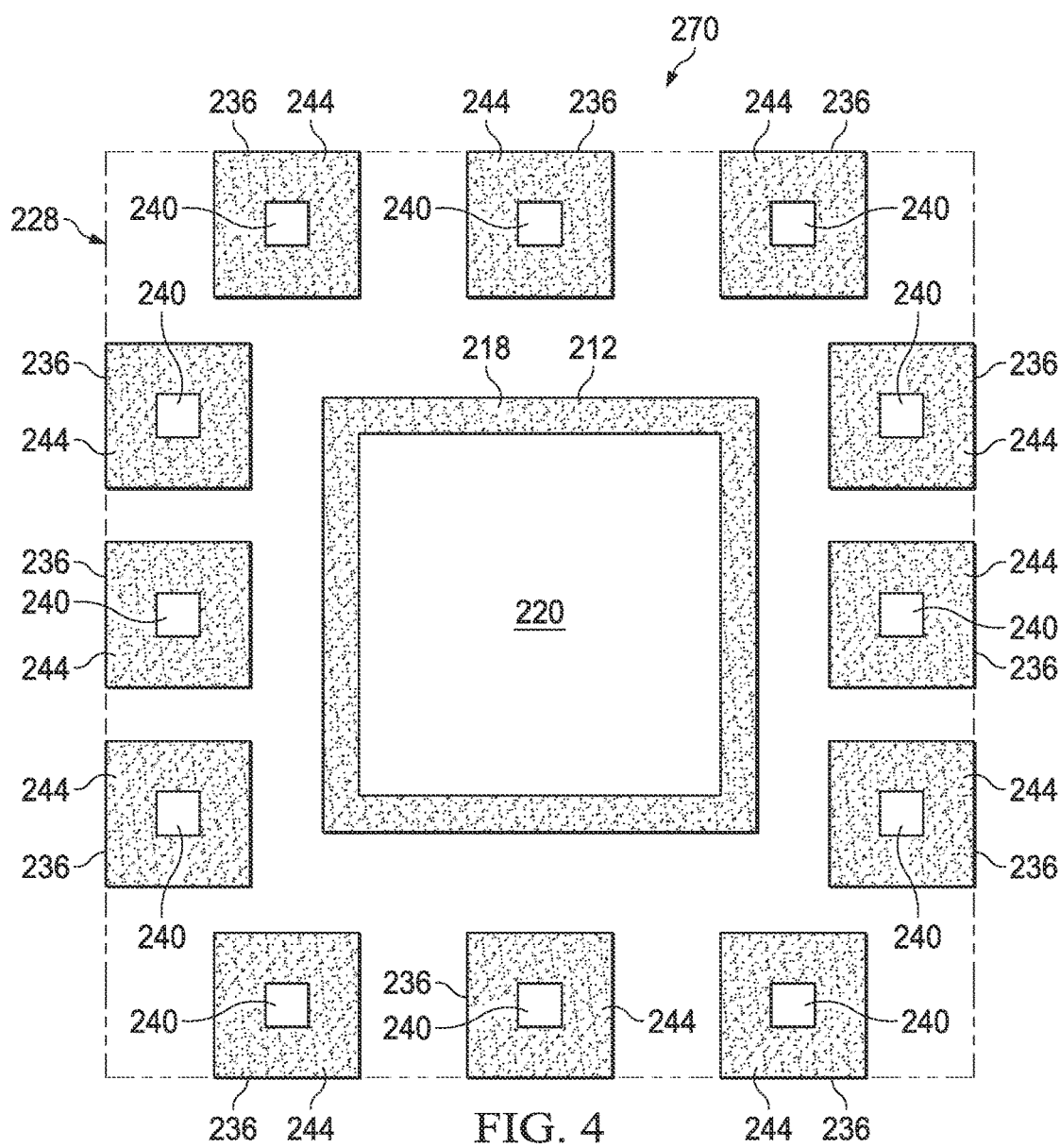
FIG. 4 illustrates an overhead view of an interconnect of FIG. 3.

FIG. 4 illustrates an overhead view 270 of the interconnect 208 of FIG. 3, wherein the die 204 is removed. Thus for purposes of simplification of explanation, FIGS. 3 and 4 employ the same reference numbers to denote the same structures. As illustrated, there are twelve (12) patches of unoxidized metal 240 on the pads 236. In other examples, there are more or less pads 236 such that there are corresponding more or less patches of unoxidized metal 240 on the pads 236. The patches of unoxidized metal 220 are circumscribed by the region of roughened metal 218 of the die pad 212. Additionally, as illustrated in the overhead view 270, the pads 236 are arranged at the periphery of the interconnect 208. The pads 236 include the patch of unoxidized metal 240 circumscribed by the region of roughened metal 244.

Referring back to FIG. 3, wire bonds 248 are coupled to a second surface 250 of the die 204 and to the patch of unoxidized metal 240 on the pads 236 through solder 252 (e.g., a solder ball or solder paste). Accordingly, the die 204 is electrically coupled to the patches of unoxidized metal 240. The second surface 250 of the die 204 opposes the first surface 224 of the die 204. Because the die 204 is electrically insulated from the patch of unoxidized metal 220, the die 204 is electrically coupled to a subset of patches of unoxidized metal, namely the patches of unoxidized metal 240.

The patches of unoxidized metal 220 of the die pad 212 enables excellent epoxy wetting. Accordingly, the patch of unoxidized metal 220 allows the die 204 to be securely adhered to the die pad 212. Similarly, the patch of unoxidized metal 240 on the pads 236 enables excellent solder wetting to allow the solder 252 to securely adhere to the pads 236. Additionally, the region of roughened metal 244 circumscribing the corresponding patch of unoxidized metal 240 prevents the solder from bridging with another connection.

The interconnect 208 and the die 204 are encased in a molding 260. The molding 260 is formed of a molding compound, such as plastic or similar material. The region of roughened metal 244 on the pads 236 and the region of roughened metal 218 of the die pad 212 improve adherence of the molding 260 to the interconnect 208.

By employment of the interconnect 208, the benefits of roughing portions (oxidizing metal) of the interconnect 208 are attained without drawbacks. More particularly, because the die pad 212 includes the patch of unoxidized metal 220 (components of the smoothed portion) and the pads 236 include the patches of unoxidized metal 240, the die 204 is securely mounted on the interconnect 208 to enable robust electrical communication between the die 204 and the pads 236. More specifically, the smoothed patches of unoxidized metal allow for excellent solder wetting. Complementarily, the interconnect 208 also includes the region of roughened metal 244 at the pads 236 (circumscribing the patches of unoxidized metal 240) and the region of roughened metal 218 of the die pad 212 (circumscribing the patch of unoxidized metal 220). The regions of oxidize metal forming the region of roughened metal 218 of the die pad 212 and the roughened metal 244 of the pads 236 provides a barrier to prevent solder bridging between connections. These regions of roughened metal also improve purchase (e.g., grip) between the interconnect 208 and the molding 260, thereby improving adherence between the molding 260 and the interconnect 208. Accordingly, providing the interconnect 208 with patches of unoxidized metal (e.g., smoothed copper) and regions of roughened metal (e.g., oxidized copper), provides the benefits of an interconnect formed with an unoxidized metal and an interconnect formed with an unoxidized metal without the respective drawbacks.

FIGS. 5-11 illustrate methods for forming interconnects for an IC package, such as the IC package 100 of FIG. 1. For purposes of simplification of explanation, FIGS. 5-11 employ the same reference numbers to denote the same structure.

Figure 5:
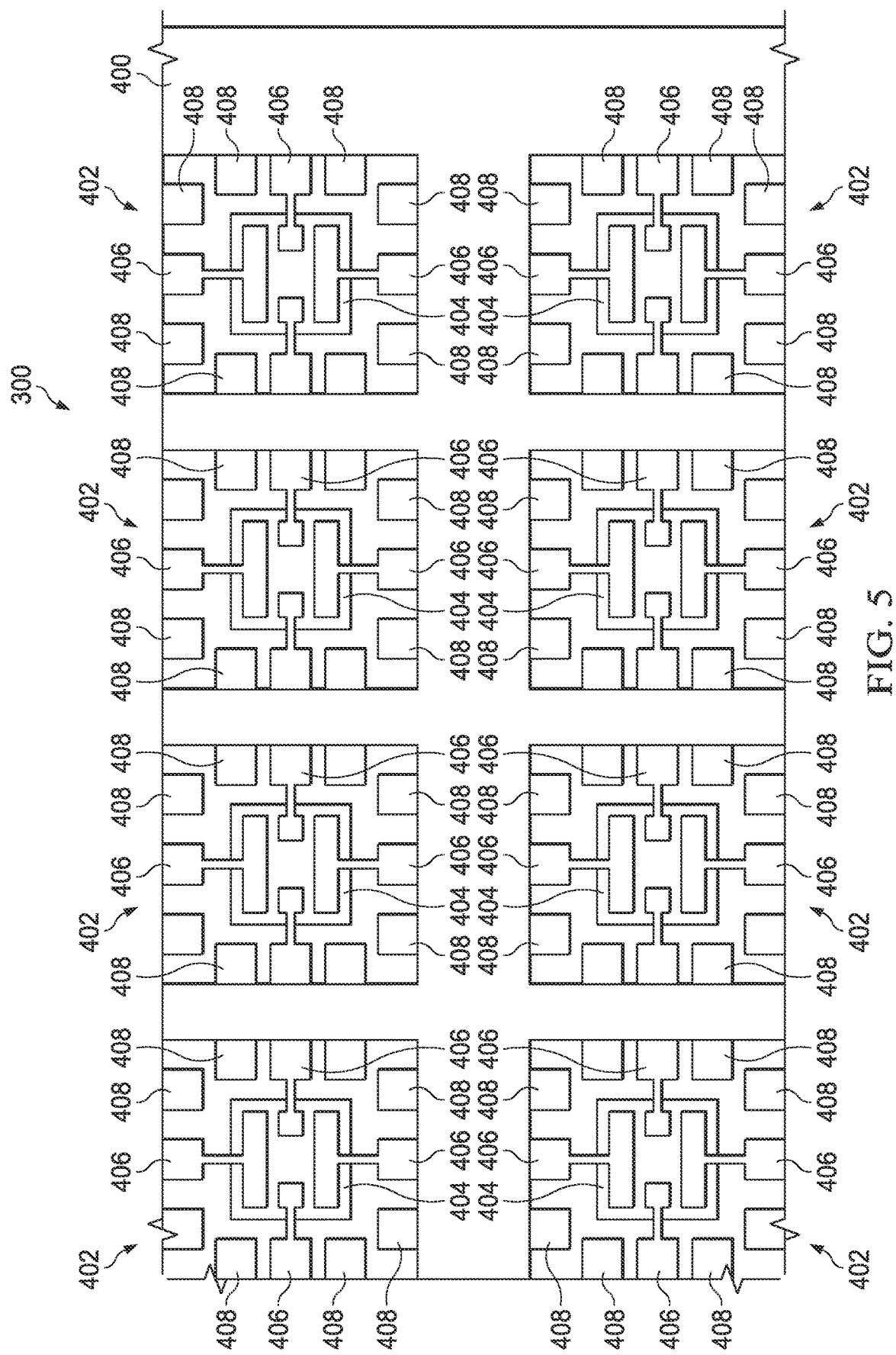
FIG. 5 illustrates a first stage of an example method for forming interconnects for IC packages.

In a first stage, as illustrated in FIG. 5, at 300, a sheet of interconnects 400 is provided. In some examples, the sheet of interconnects 400 is formed of copper (Cu). In other examples, other oxidizable metals are employable to form the sheet of interconnects. The sheet of interconnects include units 402 that are singulatable into individual interconnects, such as the interconnect 108 of FIGS. 1-2. These units 402 include a central region 404, pads 406 of a first type and pads 408 of a second type arranged around a periphery of each respective unit 402 in the sheet of interconnects 400. Only some of the pads 406 of the first type and pads 408 of the second type are labeled.

Figure 6:
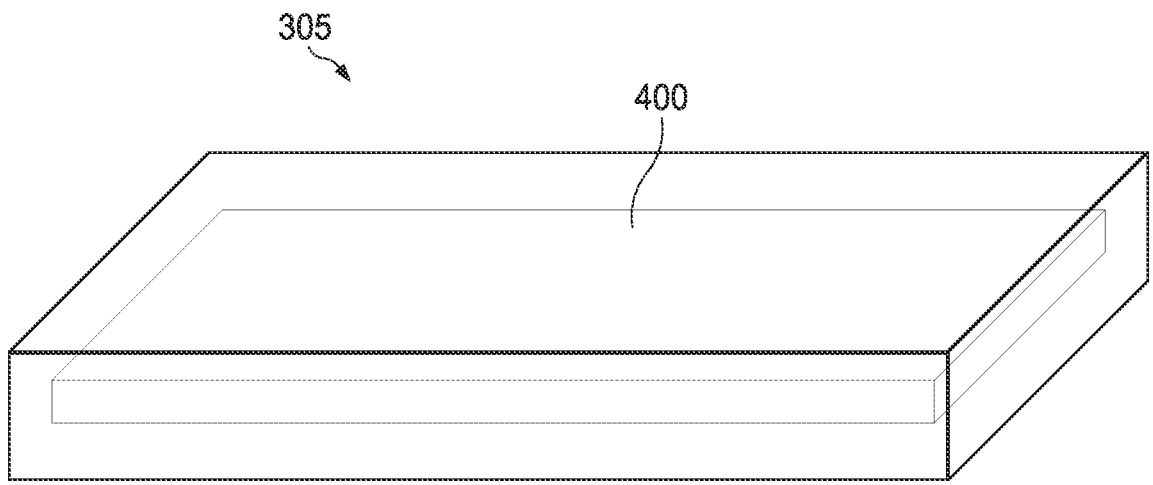
FIG. 6 illustrates a second stage of an example method for forming interconnects for IC packages.
Figure 7:
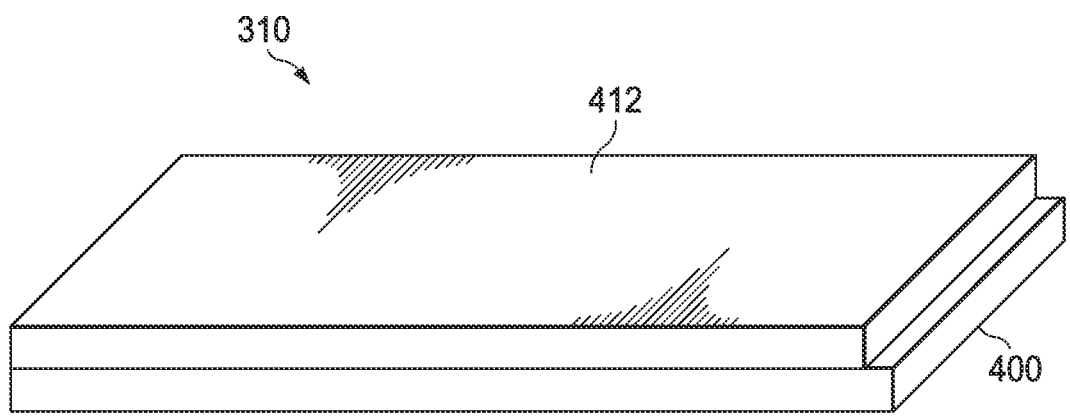
FIG. 7 illustrates a third stage of the example method for forming interconnects for IC packages.

In a second stage, as illustrated in FIG. 6, at 305, the sheet of interconnects 400 is pretreated with industrial cleaning material to clean the sheet of interconnects 400. In a third stage, as illustrated in FIG. 7, at 310, a layer of resist 412 (e.g., photoresist) is laminated (e.g., deposited) on the sheet of interconnects 400. In some examples, the layer of resist 412 is a coating of polyimide overlaying a surface of the sheet of interconnects 400.

Figure 8:
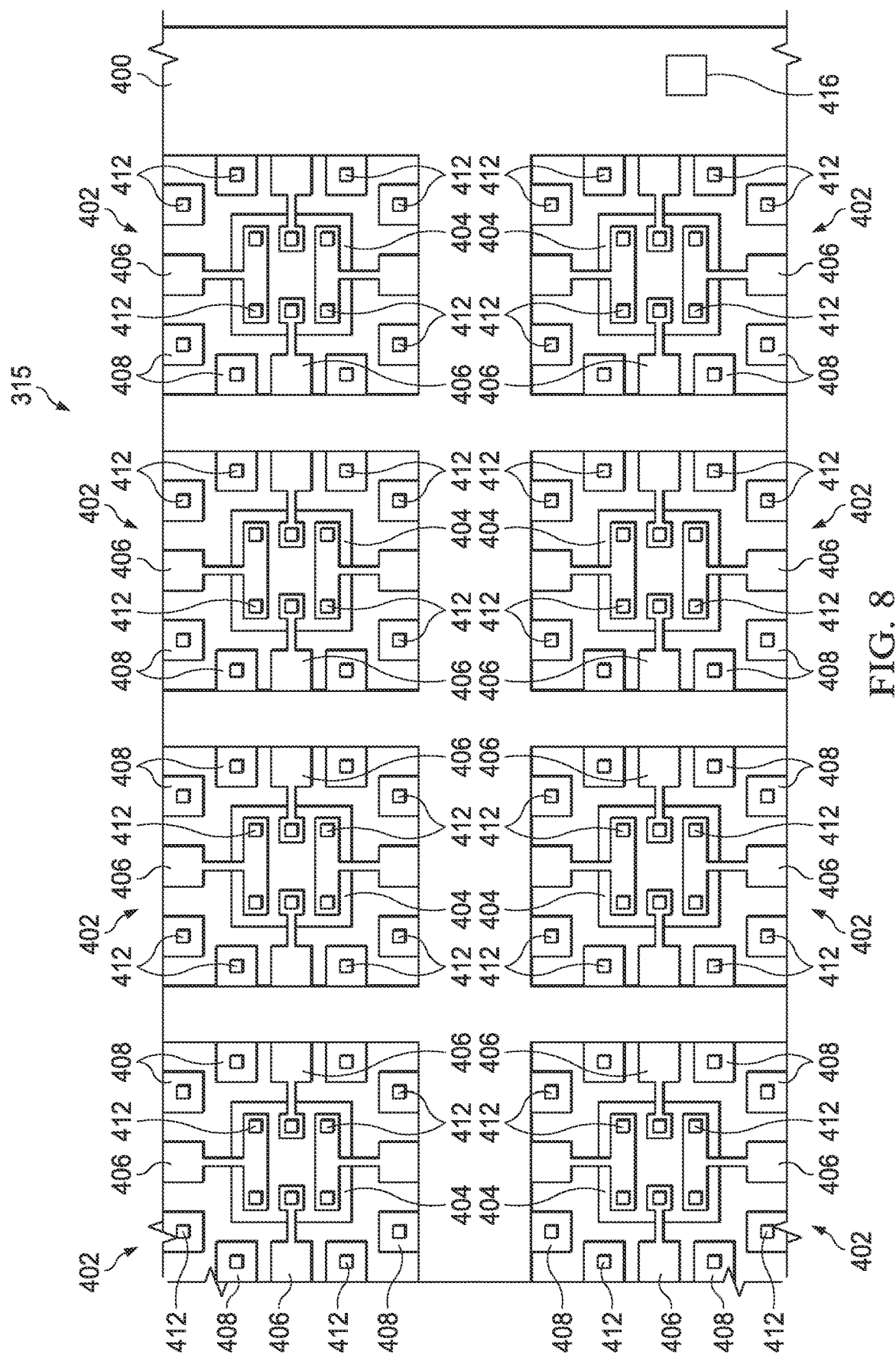
FIG. 8 illustrates a fourth stage of the example method for forming interconnects for IC packages.

In a fourth stage, as illustrated in FIG. 8 at 315, the resist 412 is selectively etched to pattern the sheet of interconnects 400 to expose portions of the sheet of metal (e.g., bare copper). Stated differently, at 315, the resist 412 is selectively etched to provide a mask of resist 412 on the sheet of interconnects 400. More particularly, the resist 412 is etched such that the resist (the resist 412 of FIG. 7) covers portions of the sheet of interconnects 400 that will form the central regions 404 and pads 406 of the interconnects, and remaining portions (only some of which are labeled) of the sheet of interconnects 400 are exposed metal. Additionally, a region 416 of the resist 412 is not etched to allow formation of a barcode on the sheet of interconnects 400.

Figure 9:
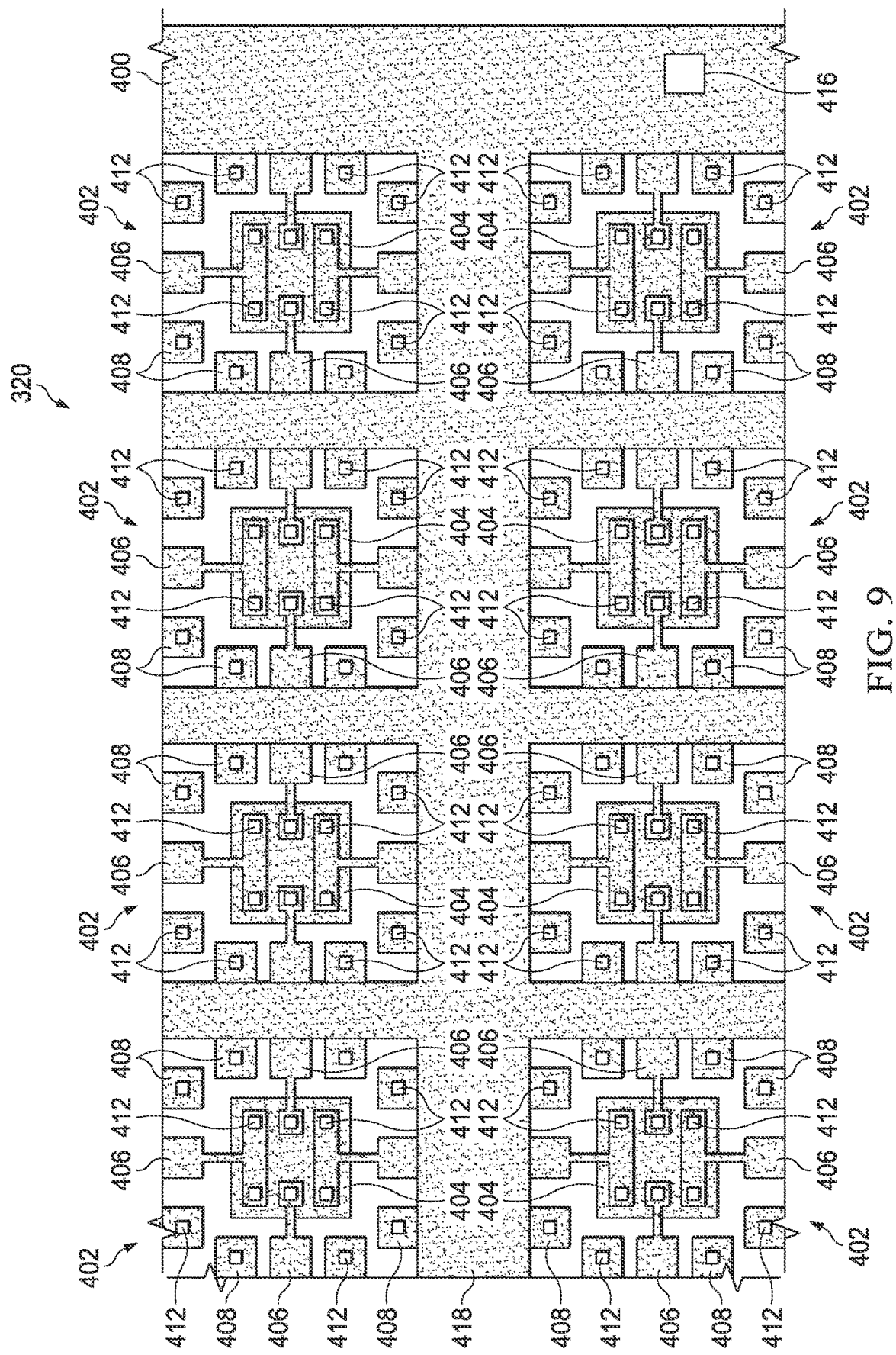
FIG. 9 illustrates a fifth stage of the example method for forming interconnects for IC packages.
Figure 10:
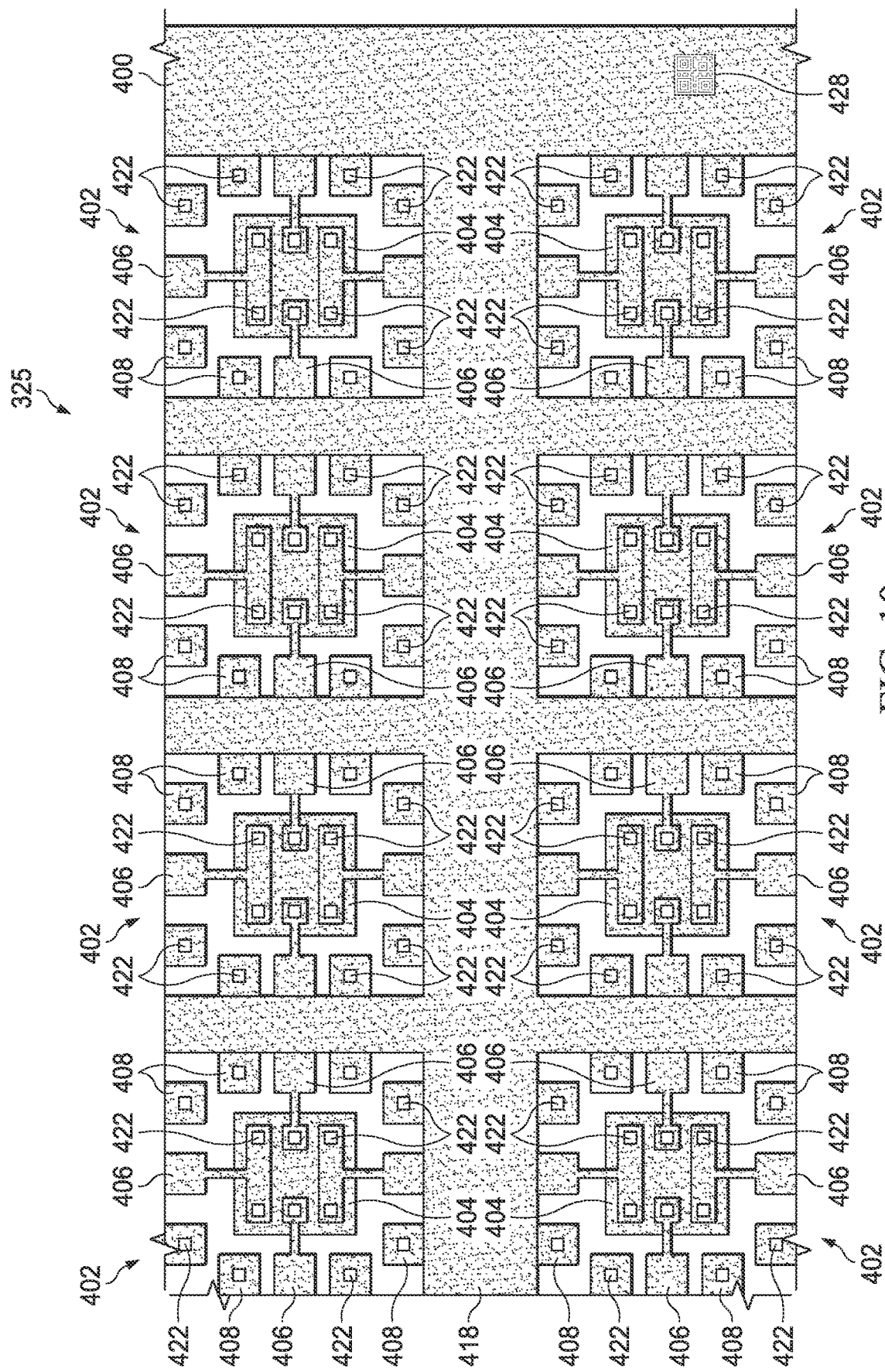
FIG. 10 illustrates a sixth stage of the example method for forming interconnects for IC packages.

In a fifth stage, as illustrated in FIG. 9 at 320, the exposed portions of the sheet of interconnects 400 are roughened. More particularly, the remaining portion of the sheet of interconnects 400 that is exposed (at operation 315) is oxidized to roughen a surface of the sheet of interconnects 400 (formed of metal) to provide a portion of roughened metal 418 of the sheet of interconnects 400. Additionally, the portions of the sheet of interconnects 400 underlying the resist 412 remain unoxidized (e.g., remain smooth). In a sixth stage, as illustrated in FIG. 10, at 325, the remaining portions of the resist 412 are removed (e.g., in a wet etching process) to reveal a sheet of interconnects 400 that each have a central region 404 and pads 406 of the first type and pads 408 of the second type. The sheet of interconnects 400 includes patches of unoxidized metal 422, only some of which are labeled. The patches of unoxidized metal 422 are employable to receive posts of a die on a central region 404 that are circumscribed by a region of roughened metal 418 (oxidized portion of metal). Further, at 325, a barcode 428 is inscribed (e.g., with a laser) on a patch of unoxidized metal corresponding to the region 416 of the resist of FIG. 9. In some examples, the barcode 428 is a two-dimensional barcode (e.g., a quick response (QR) code). In other examples, the barcode 428 is a one-dimensional barcode. The barcode 428 allows the sheet of interconnects 400 to be uniquely identified in a database. Further, by inscribing the barcode 428 on the patch of unoxidized metal 416, the readability of the barcode 428 is improved. Conversely, if a barcode were to be inscribed in the region of roughened metal 418, such a barcode would have an inconsistent surface (due to the roughing), which would make such a barcode difficult to read. Conversely, the barcode 428 is inscribed in unoxidized (smoothed) metal, enabling a scanner (or other device) to read the barcode 428 without difficulty.

Figure 11:
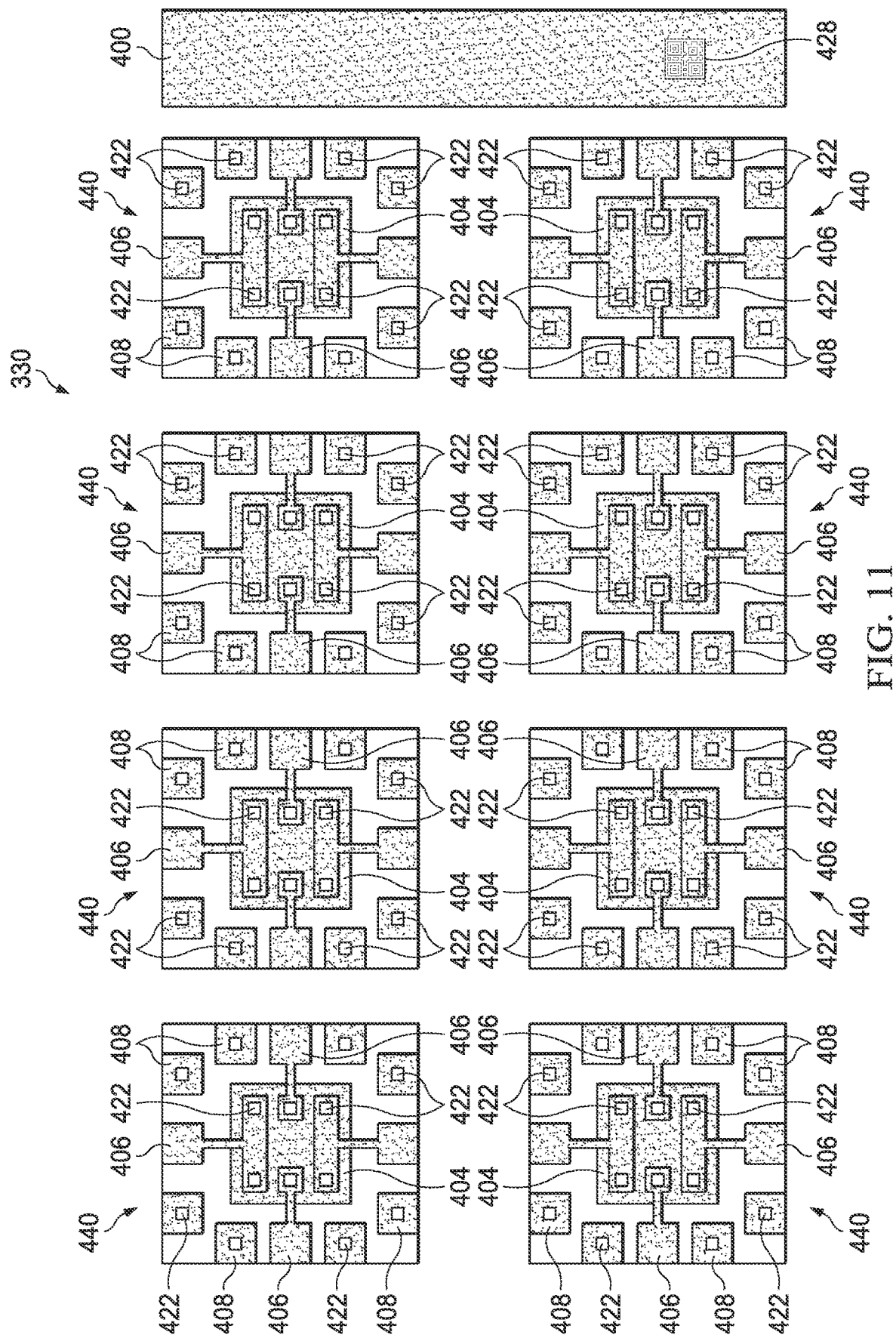
FIG. 11 illustrates a seventh stage of the example method for forming interconnects for IC packages.

In a seventh stage, as illustrated in FIG. 11, at 330, the units 402 in the sheet of interconnects 400 of FIG. 10 are singulated to provide an array of interconnects 440. The singulation can be executed, for example, with a laser, a saw, bending, stretching, etc. The singulation separates the barcode 428 from the array of interconnects 440. Each resultant interconnect 440 includes a central region 404, pads 406 of the first type and pads 408 of the second type. The central region 404 of the interconnects 440 and the pads 408 of the second type include patches of unoxidized metal 422 for mounting posts. Additionally, the pads 406 of the first type of the interconnects 440 are covered with roughened metal. Each interconnect 440 is employable to implement the interconnect 108 of FIGS. 1 and 2.

Figure 12:
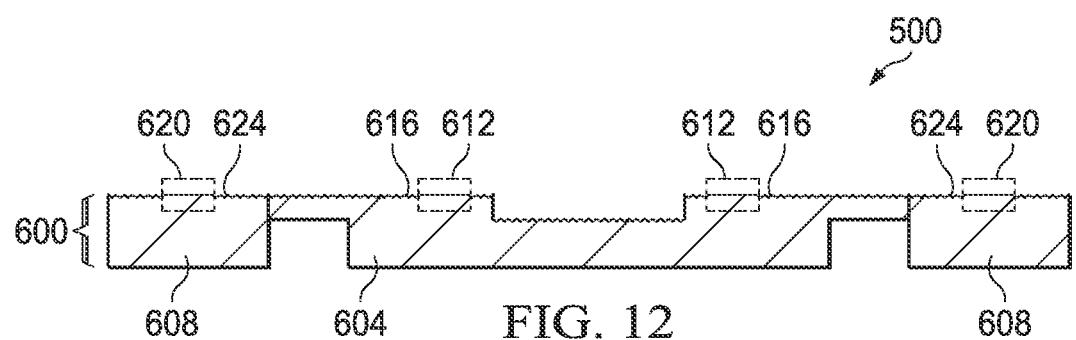
FIG. 12 illustrates a first stage of an example method for forming an IC package.
Figure 13:
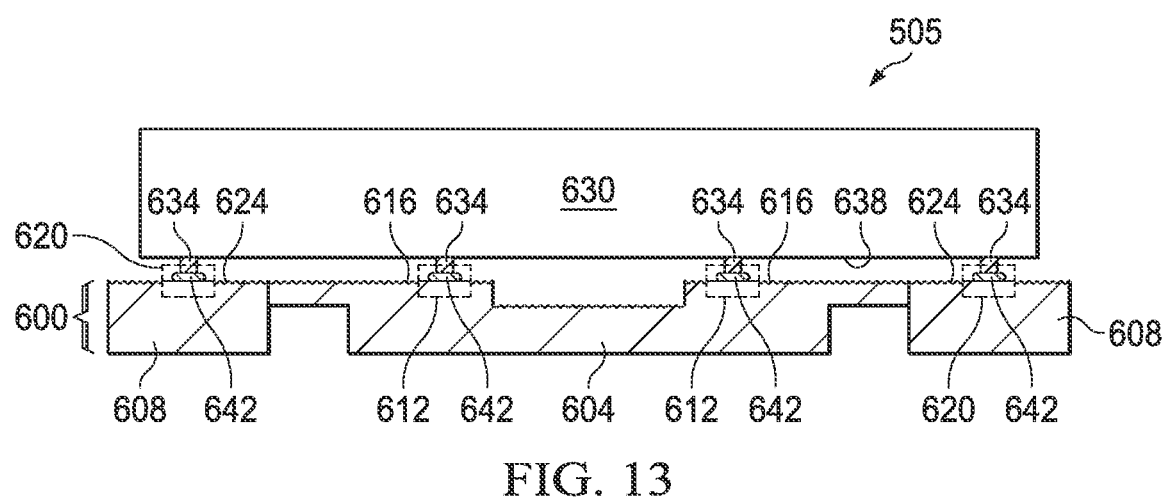
FIG. 13 illustrates a second stage of the example method for forming an IC package.
Figure 14:
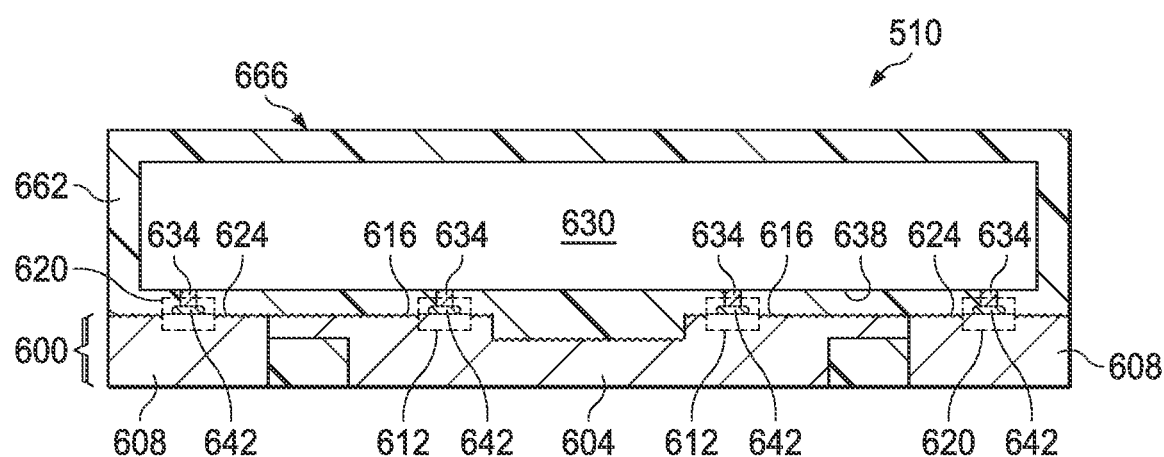
FIG. 14 illustrates a third stage of the example method for forming the IC package.

FIGS. 12-14 illustrate methods for forming an IC package using flip chip techniques, such as the IC package 100 of FIG. 1. For purposes of simplification of explanation, FIGS. 12-14 employ the same reference numbers to denote the same structure.

In a first stage, as illustrated in FIG. 12, at 500, an interconnect 600 is provided. In some examples, the interconnect 600 is formed from the method of FIGS. 5-11. The interconnect 600 includes a central region 604 situated at a center of the interconnect 600. Also, the interconnect 600 includes pads 608 (e.g., pads 136 of the first type of FIG. 1) arranged at a periphery of the interconnect 600. The central region 604 includes spaced apart patches of unoxidized metal 612 (smoothed regions) that are circumscribed by a region of roughened metal 616 (oxidized metal). Similarly, the pads 608 include patches of unoxidized metal 620 circumscribed by regions of roughened metal 624.

In a second stage, as illustrated in FIG. 13, at 505, a die 630 is mounted on the interconnect 600. The die 630 includes posts 634 extending from a surface 638 of the die 630 to a corresponding patch of unoxidized metal 612. The posts 634 are mounted on the spaced apart patches of unoxidized metal 612 with solder 642, such as solder past or a solder ball. The region of roughened metal 616 impedes the flow of solder. Thus, the solder 642 for adhering each respective post 634 to a corresponding patch of unoxidized metal 612 is contained within or near the boundaries of the patch of unoxidized metal 612, such that solder bridges between posts 634 are not inadvertently formed.

In a third stage, as illustrated in FIG. 14, at 510, a molding 662 (e.g., a molding compound) encases the interconnect 600 and the die 630 to form the IC package 666. The regions of roughened metal 624 on the pads 608 and the region of roughened metal 616 on the central region 604 ensure that the molding 662 is securely adhered to the interconnect 600. Accordingly, as described herein, providing the interconnect 600 with patches of unoxidized metal (e.g., smoothed copper) and regions of roughened metal (e.g., oxidized copper), provides the benefits of an interconnect formed of an oxidized metal and an interconnect formed of an unoxidized metal without the respective drawbacks.

FIGS. 15-21 illustrate another example method for forming interconnects for an IC package, such as the IC package 200 of FIG. 3. For purposes of simplification of explanation, FIGS. 15-21 employ the same reference numbers to denote the same structure.

Figure 15:
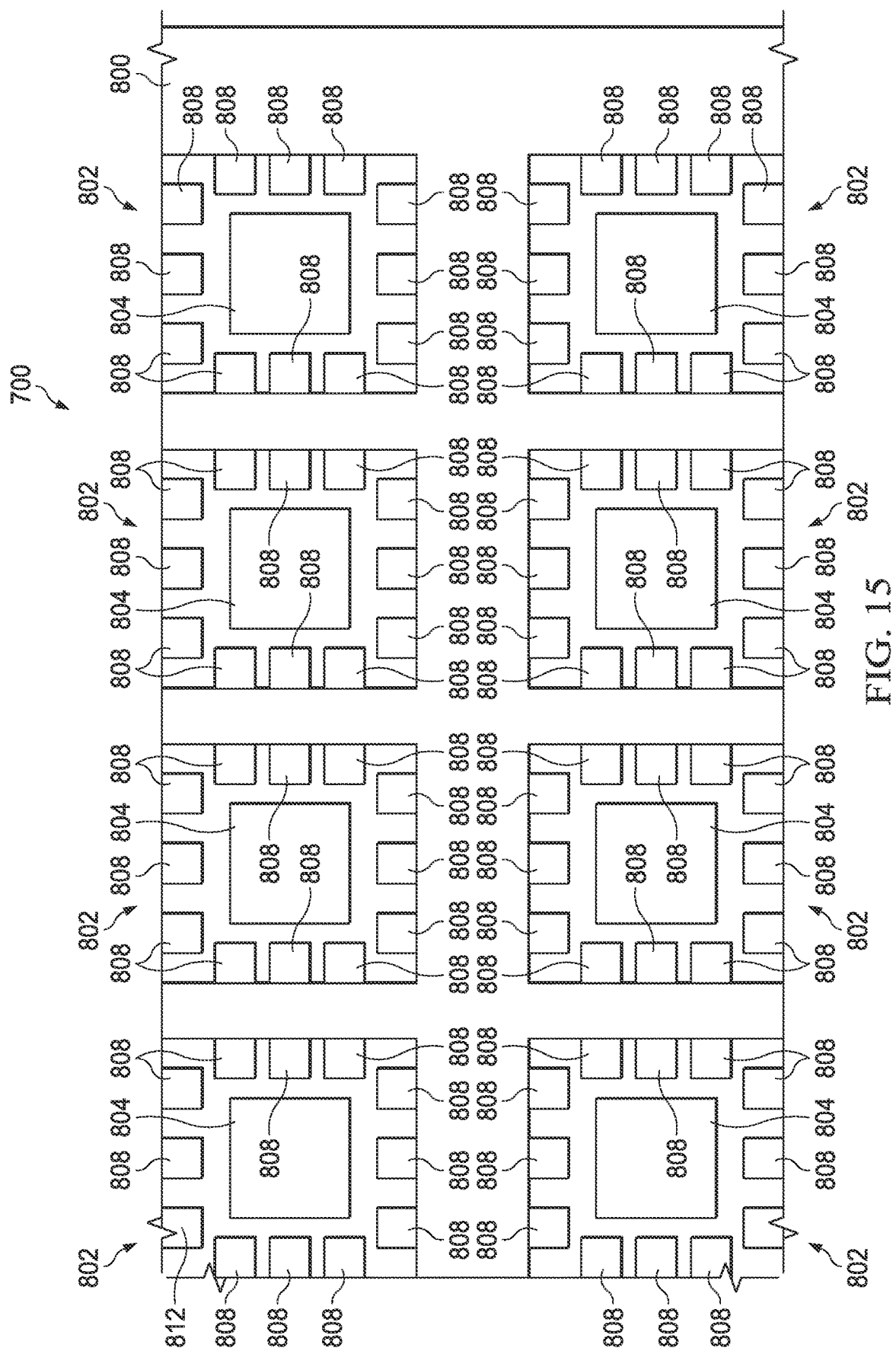
FIG. 15 illustrates a first stage of another example method for forming interconnects for IC packages.

In a first stage, as illustrated in FIG. 15, at 700, a sheet of interconnects 800 is provided. In some examples, the sheet of interconnects 800 is formed of copper (Cu). In other examples, other oxidizable metals are employable to form the sheet of interconnects. The sheet of interconnects include units 802 that are singulatable into individual interconnects, such as the interconnect 208 of FIGS. 3-4. These units 802 include a die pad 804 and pads 808 arranged around a periphery of each respective unit 802 in the sheet of interconnects 800. Only some of the pads 808 are labeled.

Figure 16:
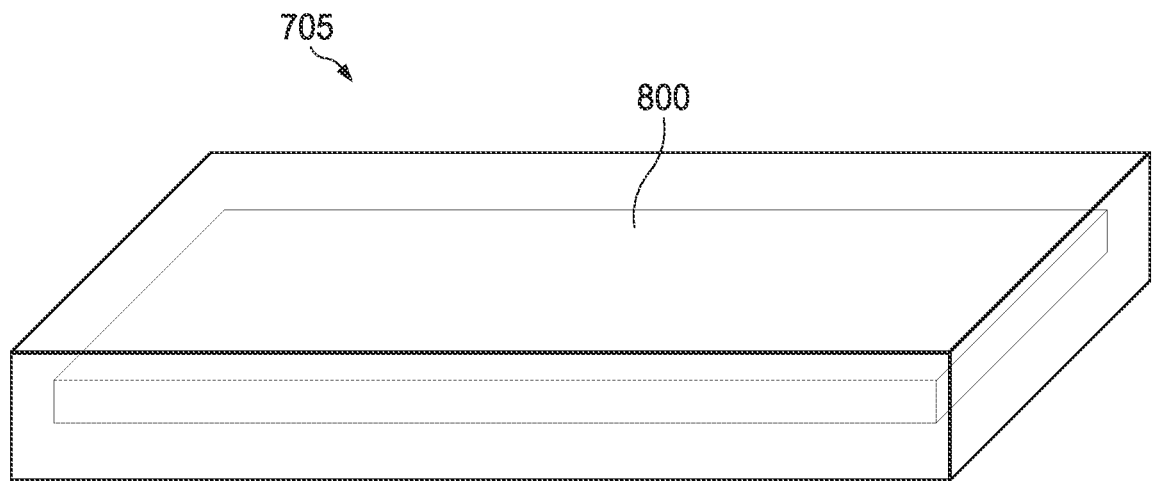
FIG. 16 illustrates a second stage of the other example method for forming interconnects for IC packages.
Figure 17:
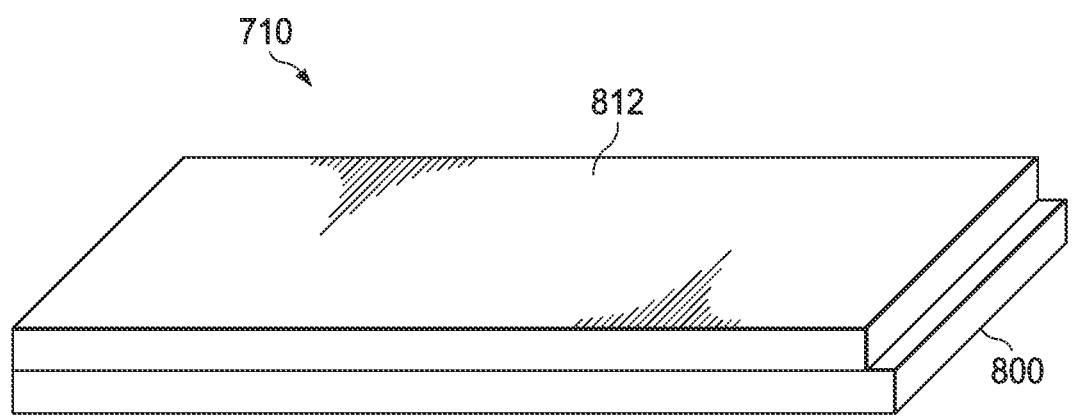
FIG. 17 illustrates a third stage of the other example method for forming interconnects for IC packages.

In a second stage, as illustrated in FIG. 16, at 705, the sheet of interconnects 800 is pretreated with industrial cleaning material to clean the sheet of interconnects 800. In a third stage, as illustrated in FIG. 17, at 710, a layer of resist 812 (e.g., photoresist) is laminated (e.g., deposited) on the sheet of interconnects 800. In some examples, the layer of resist 812 is a coating of polyimide overlaying a surface of the sheet of interconnects 800.

Figure 18:
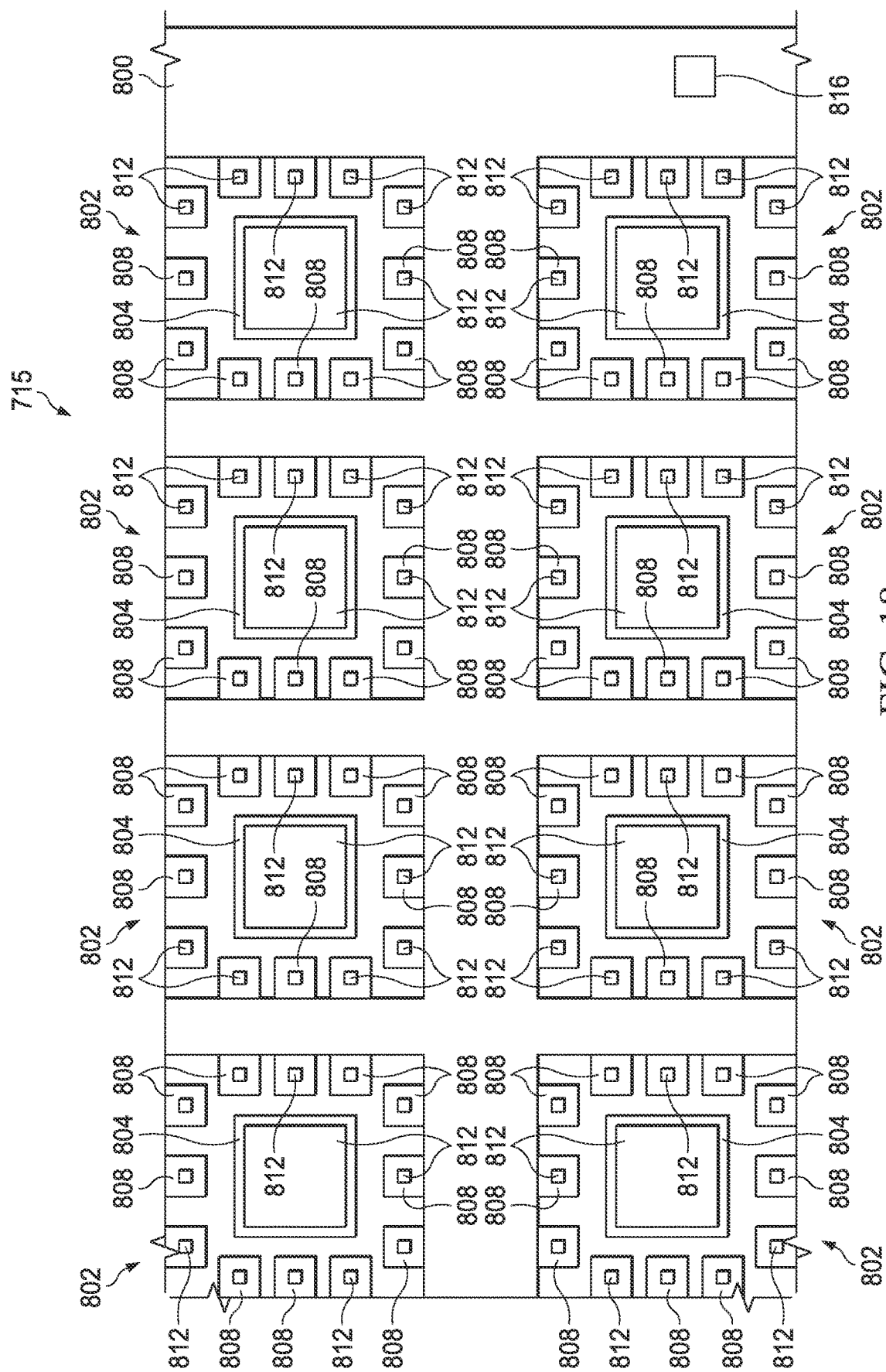
FIG. 18 illustrates a fourth stage of the other example method for forming interconnects for IC packages.

In a fourth stage, as illustrated in FIG. 18 at 715, the resist 812 is selectively etched to pattern the sheet of interconnects 800 to expose portions of the sheet of metal (e.g., bare copper). Stated differently, at 315, the resist 812 is selectively etched to provide a mask of resist 812 on the sheet of interconnects 800. More particularly, the resist 812 is etched such that the resist (the resist 812 of FIG. 17) covers portions of the sheet of interconnects 800 that will form the die pads 804 and pads 808 of the interconnects, and remaining portions (only some of which are labeled) of the sheet of interconnects 800 are exposed metal. Additionally, a region 816 of the resist 812 is not etched to allow formation of a barcode on the sheet of interconnects 800.

Figure 19:
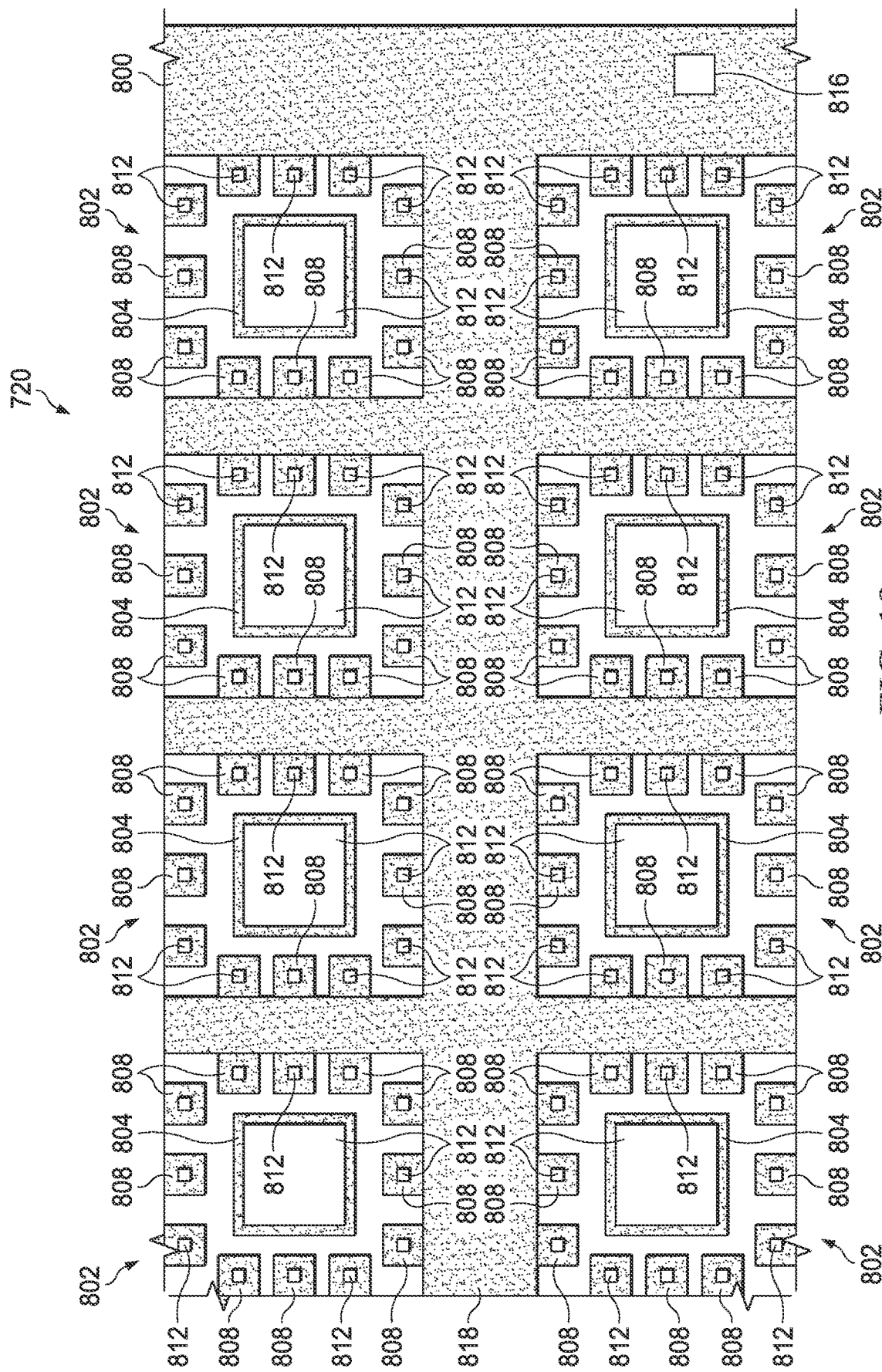
FIG. 19 illustrates a fifth stage of the other example method for forming interconnects for IC packages.
Figure 20:
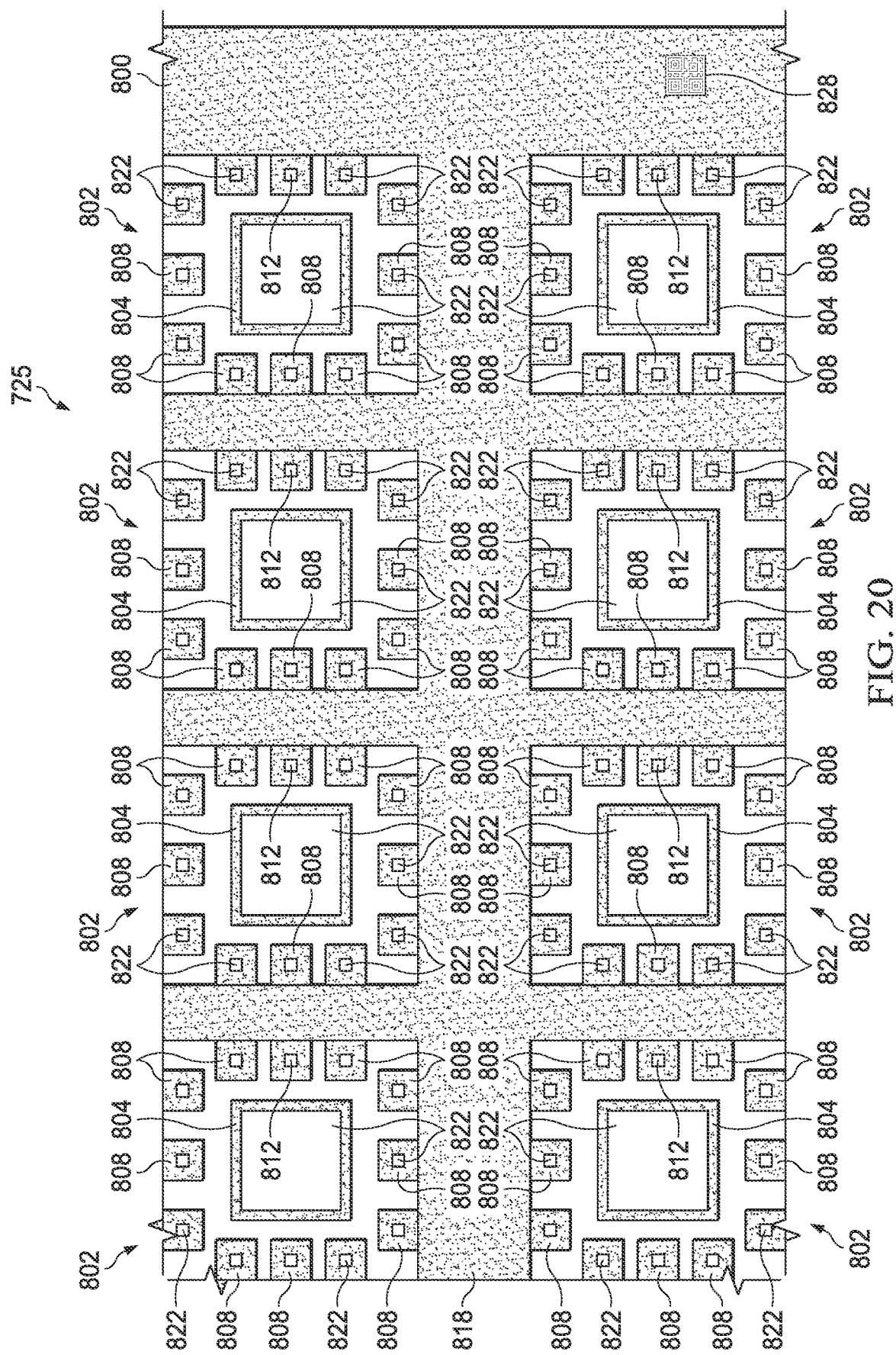
FIG. 20 illustrates a sixth stage of the other example method for forming interconnects for IC packages.

In a fifth stage, as illustrated in FIG. 19 at 720, the exposed portions of the sheet of interconnects 800 are roughened. More particularly, the remaining portion of the sheet of interconnects 800 that is exposed (at operation 315) is oxidized to roughen a surface of the sheet of interconnects 800 (formed of metal) to provide a portion of roughened metal 818 of the sheet of interconnects 800. Additionally, the portions of the sheet of interconnects 800 underlying the resist 812 remain unoxidized (e.g., remain smooth). In a sixth stage, as illustrated in FIG. 20, at 725, the remaining portions of the resist 812 are removed (e.g., in a wet etching process) to reveal a sheet of interconnects 800 that each have a die pad 804 and pads 808 of the second type. The sheet of interconnects 800 includes patches of unoxidized metal 822, only some of which are labeled. The patches of unoxidized metal 822 on the die pad 804 are employable to mount a die, and the patches of unoxidized metal 822 on the pads 808 are employable for attaching a wire bond to couple the die and the pads 808. The patches of unoxidized metal 822 are circumscribed by a region of roughened metal 818 (oxidized portion of metal). Further, at 325, a barcode 828 is inscribed (e.g., with a laser) on a patch of unoxidized metal corresponding to the region 816 of the resist of FIG. 19. In some examples, the barcode 828 is a two-dimensional barcode (e.g., a QR code). In other examples, the barcode 828 is a one-dimensional barcode. The barcode 828 allows the sheet of interconnects 800 to be uniquely identified in a database. Further, by inscribing the barcode 828 on the patch of unoxidized material, the readability of the barcode 828 is improved. Conversely, if a barcode were to be inscribed in the region of roughened metal 818, such a barcode would have an inconsistent surface (due to the roughing), which would make such a barcode difficult to read. In contrast, the barcode 828 is inscribed in unoxidized (smoothed) metal, enabling a scanner (or other device) to read the barcode 828 without difficulty.

Figure 21:
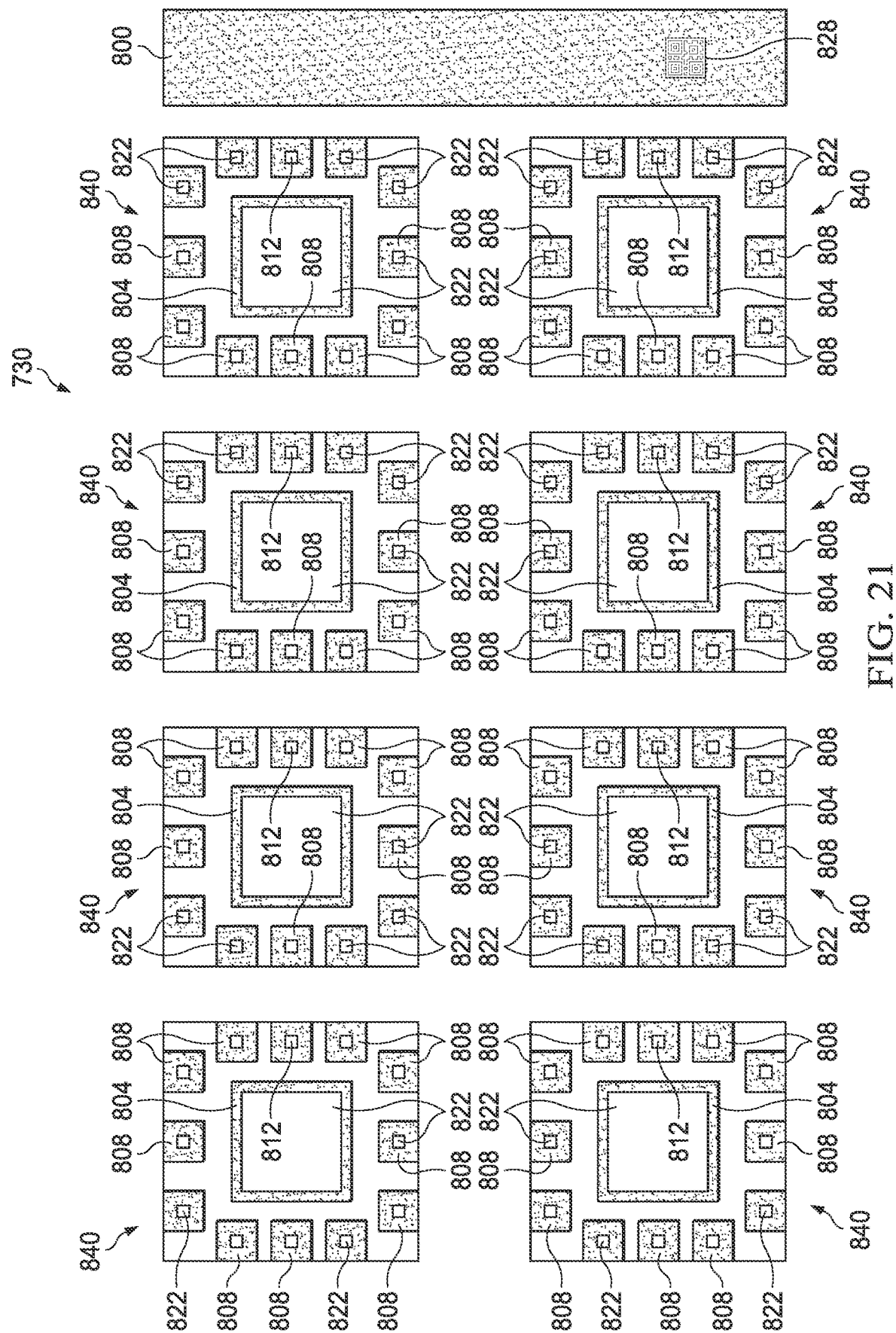
FIG. 21 illustrates a seventh stage of the other example method for forming interconnects for IC packages.

In a seventh stage, as illustrated in FIG. 21, at 730, the units 802 in the sheet of interconnects 800 of FIG. 20 are singulated to provide an array of interconnects 840. The singulation can be executed, for example, with a laser, a saw, bending, stretching, etc. The singulation separates the barcode 828 from the array of interconnects 840. Each resultant interconnect 840 includes a die pad 804 and pads 808. The die pad 804 of the interconnects 840 and the pads 808 include patches of unoxidized metal 822 for mounting posts. Each interconnect 840 is employable to implement the interconnect 208 of FIGS. 3 and 4.

FIGS. 22-25 illustrate methods for forming an IC package using wire bonding, such as the IC package 200 of FIG. 3. For purposes of simplification of explanation, FIGS. 22-25 employ the same reference numbers to denote the same structure.

In a first stage, as illustrated in FIG. 22, at 900, an interconnect 1000 is provided. In some examples, the interconnect 1000 is formed from the method of FIGS. 15-21. The interconnect 1000 includes a die pad 1004 situated at a center of the interconnect 1000. Also, the interconnect 1000 includes pads 1008 arranged at a periphery of the interconnect 1000. The die pad 1004 includes a patch of unoxidized metal 1012 (smoothed regions) on a surface 1016 that is circumscribed by a region of roughened metal 1018 (oxidized metal). Similarly, the pads 1008 include patches of unoxidized metal 1020 circumscribed by regions of roughened metal 1024.

In a second stage, as illustrated in FIG. 23, at 905, a die 1030 is mounted on the die pad 1004 of the interconnect 1000. More particularly, a first surface 1034 of the die 1030 is mounted on the patch of unoxidized metal 1012 with an epoxy 1038. The region of roughened metal 1018 impedes the flow of epoxy 1038.

In a third stage, as illustrated in FIG. 24 at 910, wire bonds 1050 are mounted on a second side 1054 of the die 1030 and on a respective pad 1008. The wire bonds 1050 are mounted on the pads 1008 with solder 1058 (e.g., a solder ball or solder paste). The region of roughened metal 1024 on each pad 1008 impedes the flow of solder, such that the solder 1058 is contained within or near boundaries of the patch of unoxidized metal 1020.

In a fourth stage, as illustrated in FIG. 25, at 915, a molding 1062 (e.g., a molding compound) encases the interconnect 1000 and the die 1030 to form the IC package 1066. The regions of roughened metal 1024 on the pads 1008 and the region of roughened metal 1018 on the die pad 1004 ensure that the molding 1062 is securely adhered to the interconnect 1000. Accordingly, as described herein, providing the interconnect 1000 with patches of unoxidized metal (e.g., smoothed copper) and regions of roughened metal (e.g., oxidized copper), provides the benefits of an interconnect formed of an oxidized metal and an interconnect formed of an unoxidized metal without the respective drawbacks.

FIG. 26 illustrates a flowchart of an example method 1100 for providing interconnects for forming IC packages, such as the IC package 100 of FIG. 1 or the IC package 200 of FIG. 2. At 1105, a sheet of interconnects (e.g., the sheet of interconnects 400 of FIG. 5 or the sheet of interconnects 800 of FIG. 15) is provided.

The sheet of interconnects includes units that are singulatable into individual interconnects. The sheet of interconnects is formed, for example, with copper. At 1110, the sheet of interconnects is pretreated in a cleaning process.

At 1115, a layer of resist (e.g., the resist 412 of FIG. 7) is deposited on the sheet of interconnects, such that the resist overlays the sheet of interconnects. At 1120, the resist is selectively etched to provide a mask on the sheet of interconnects, such as illustrated in FIG. 8. More specifically, the resist is etched such that patches (e.g., the patches of resist 412 of FIG. 8) of the resist are circumscribed by exposed bare metal.

At 1125, in response to the selectively etching, the sheet of interconnects are roughened such that the exposed bare metal is oxidized. Conversely, portions of the sheet of interconnects covered by the patches of resist remain unoxidized.

At 1130, a remaining portion of the resist (e.g., the patches of resist) is removed to provide a sheet of interconnects comprising a units that have a smoothed portion of unoxidized metal and a roughened portion of metal. The smoothed portion of the units are spaced apart patches of unoxidized metal on a die pad and a patch of unoxidized metal on pads of the units. At 1135, a barcode (e.g., the barcode 428 of FIG. 10) is inscribed (e.g., with a laser) in a particular patch of unoxidized metal.

At 1140, the units in the sheet of interconnects are singulated to provide individual interconnects. The units are singulated, for example, by lasing, sawing, stretching and/or bending. At 1145, IC packages are formed using some or all of the (singulated) interconnects.

FIG. 27 illustrates a flowchart of an example method 1200 for fabricating an IC package with an interconnect (e.g., the interconnect 108 of FIG. 1 or the interconnect 208 of FIG. 3). In some examples, the IC package is a QFN IC package. In other examples, the IC package is a DFN IC package. The method 1200 is employable to implement an instance of the operation at 1145 of FIG. 26 (e.g., as a sub-process). In some examples, the interconnect includes a central region (e.g., the central region 112 of FIG. 1) with spaced apart patches of unoxidized metal (e.g., unoxidized copper) In other examples, the interconnect includes a die pad. Additionally, the interconnect includes pads (e.g., the pads 136 of FIG. 1) that have a patch of unoxidized metal. A remaining portion of the die pad and the pads is oxidized metal (e.g., oxidized copper).

At 1205, a die (e.g., the die 104 of FIG. 1) is mounted on the interconnect. In some examples, such as examples where the die is mounted using flip chip techniques, the die includes posts that extend from a surface of the die. In this example, the posts are situated to contact the patches of unoxidized metal and are adhered to such patches with solder. In other examples, such as examples where the die is mounted using wire bonding, a first surface of the die is mounted on a die pad and adhered to a patch of the unoxidized metal on the die pad with an epoxy.

At 1210, in some examples, wire bonds are attached to a second surface of the die and to the patches of unoxidized metal on the pads of the interconnect. The second surface of the die opposes the first surface of the die. In other examples, the operations at 1210 are omitted. At 1215, a molding is applied to encase the die and the interconnect in the molding (e.g., the molding 160 of FIG. 1) to provide the IC package. The roughened portion of the interconnect (e.g., the portions of oxidized metal) enable improved purchase (e.g., grip) for the molding to adhere to the interconnect.

Modifications are possible in the described embodiments, and other embodiments are possible, within the scope of the claims.

What is claimed is:

1. An integrated circuit (IC) package comprising:
   an interconnect comprising patches of unoxidized metal that are circumscribed by a region of roughened metal formed of oxidized metal;
   pads arranged at a periphery of the interconnect, wherein the pads comprise a patch of the patches of unoxidized metal circumscribed by a portion of the region of roughened metal; and
   a die mounted on the interconnect, wherein the die is conductively coupled to at least a subset of the patches of unoxidized metal.

2. The IC package of claim 1, wherein the unoxidized metal is copper and the oxidized metal is oxidized copper.

3. The IC package of claim 1, wherein the die comprises posts that extend to the spaced apart patches of unoxidized metal.

4. The IC package of claim 3, wherein the region of roughened metal provides a barrier to prevent solder adhering to one of the posts from bridging to others of the posts.

5. The IC package of claim 1, further comprising:
   a molding that encases the die and the interconnect.

6. The IC package of claim 1, wherein the IC package is a quad flat no leads (QFN) IC package.

7. An integrated circuit (IC) package comprising:
   pads adjacent to and at a periphery of a die, wherein the pads each comprise a patch of unoxidized metal circumscribed by a portion of a region of roughened metal; and
   a die mounted on the patches of unoxidized metal, there being no gap between a side surface of at least one of the patches of unoxidized metal and a side surface of the region of roughened metal formed of oxidized metal, wherein the die is conductively coupled to at least a subset of the patches of unoxidized metal.

8. The IC package of claim 7, wherein the unoxidized metal is copper and the oxidized metal is oxidized copper.

9. The IC package of claim 7, wherein the die comprises posts that extend to the spaced apart patches of unoxidized metal.

10. The IC package of claim 9, wherein the region of roughened metal provides a barrier to prevent solder adhering to one of the posts from bridging to others of the posts.

11. The IC package of claim 7, further comprising:
    a molding that encases the die and at least portions of the patches of unoxidized metal that are circumscribed by the region of roughened metal formed of oxidized metal.

12. The IC package of claim 7, wherein the IC package is a quad flat no leads (QFN) IC package.

13. An integrated circuit (IC) package comprising:
    a die attach pad formed of oxidized metal;
    pads spaced from a periphery of the die attach pad, at least some of the pads comprising a patch of unoxidized metal circumscribed by a region of oxidized metal;
    a die mounted on the die attach pad; and wherein the die is conductively coupled to at least a subset of the patches of the pads.

14. The IC package of claim 13, wherein the die comprises posts that extend to the pads spaced from the periphery of the die attach pad.

15. The IC package of claim 14, wherein the oxidized metal provides a barrier to prevent solder adhering to a given post of the posts to the die pad from bridging to another post of the posts.

16. The IC package of claim 13, further comprising:
a molding that encases the die and at least portions of the die attach pad and the pads spaced from the periphery of the die attach pad.

17. The IC package of claim 13, wherein the IC package is a quad flat no leads (QFN) IC package.

18. An integrated circuit (IC) package comprising:
a die attach pad including a patch of unoxidized metal circumscribed by a region of roughened metal formed of oxidized metal;
a die mounted on the patch of unoxidized metal; and
wherein at least some of the pads include patches of unoxidized metal that are circumscribed by a region of roughened metal formed of oxidized metal, there being no gap between a side surface of at least one of the patches of unoxidized metal and a side surface of the region of roughened metal formed of oxidized metal, wherein the die is conductively coupled to at least a subset of the patches of unoxidized metal.

19. The IC package of claim 18, further including pads spaced from the periphery of the die attach pad.

20. The IC package of claim 19, wherein the die comprises bond pads electrically coupled to the pads spaced from the periphery of the die attach pad.

21. The IC package of claim 19, further comprising:
a molding that encases the die and covers at least portions of the die attach pad and the pads spaced from the periphery of the die attach pad.

22. The IC package of claim 21, wherein the IC package is a quad flat no leads (QFN) IC package.

23. The IC package of claim 18, wherein the die comprises bond pads electrically coupled to the pads spaced from the periphery of the die attach pad.

* * * * *